United States Patent
Kaneko

(10) Patent No.: US 7,126,977 B2
(45) Date of Patent: Oct. 24, 2006

(54) SURFACE EMITTING SEMICONDUCTOR LASER AND MANUFACTURING METHOD THEREOF, LIGHT MODULE, LIGHT TRANSMISSION DEVICE

(75) Inventor: Tsuyoshi Kaneko, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 240 days.

(21) Appl. No.: 10/665,447

(22) Filed: Sep. 22, 2003

(65) Prior Publication Data

US 2004/0114654 A1    Jun. 17, 2004

(30) Foreign Application Priority Data

Sep. 25, 2002   (JP)   ............................ 2002-279066

(51) Int. Cl.
*H01S 3/04* (2006.01)
*H01S 3/08* (2006.01)

(52) U.S. Cl. ...................... 372/99; 372/43.01; 372/96; 372/98

(58) Field of Classification Search ............. 372/43.01, 372/44.01, 92, 98–99
See application file for complete search history.

(56) References Cited

U.S. PATENT DOCUMENTS

| | | | | |
|---|---|---|---|---|
| 5,256,596 A | * | 10/1993 | Ackley et al. ................. | 438/39 |
| 5,428,634 A | * | 6/1995 | Bryan et al. ............. | 372/45.01 |
| 5,831,960 A | * | 11/1998 | Jiang et al. .................. | 369/121 |
| 5,838,715 A | * | 11/1998 | Corzine et al. ................ | 372/96 |
| 5,917,848 A | * | 6/1999 | Claisse et al. ................ | 372/96 |
| 6,026,111 A | * | 2/2000 | Jiang et al. .................... | 372/96 |
| 6,144,682 A | * | 11/2000 | Sun .......................... | 372/45.01 |
| 6,160,834 A | * | 12/2000 | Scott ............................ | 372/96 |
| 6,185,241 B1 | * | 2/2001 | Sun .............................. | 372/96 |
| 6,590,917 B1 | * | 7/2003 | Nakayama et al. ........ | 372/45.01 |
| 6,618,414 B1 | * | 9/2003 | Wasserbauer et al. .... | 372/45.01 |
| 6,653,157 B1 | * | 11/2003 | Kondo ......................... | 438/22 |
| 6,751,245 B1 | * | 6/2004 | Wasserbauer et al. .... | 372/46.01 |
| 6,865,214 B1 | * | 3/2005 | Kim ............................ | 372/96 |
| 6,905,900 B1 | * | 6/2005 | Johnson et al. ............... | 438/29 |
| 6,936,839 B1 | * | 8/2005 | Taylor .......................... | 257/20 |

(Continued)

FOREIGN PATENT DOCUMENTS

EP   1 130 720 A1   9/2001

(Continued)

OTHER PUBLICATIONS

R. A. Morgan et al.; "Hybrid Dielectric/AlGaAs Mirror Spatially Filtered Verical Cavity Top-Surface Emitting Laser"; Applied Physics Letters; vol. 66, No. 15; Mar. 1995; pp. 1157-1159.

(Continued)

*Primary Examiner*—James Menefee
*Assistant Examiner*—Phillip Nguyen
(74) *Attorney, Agent, or Firm*—Oliff & Berridge, PLC.

(57) ABSTRACT

The invention provides surface emitting semiconductor laser where a transverse mode is controllable stably, a method of manufacturing it and a light module and a light transmission device including the surface emitting semiconductor laser are provided. A surface-emitting laser of the present invention can include a resonator formed on a substrate and can emit a laser from a emitting surface installed on the upper surface of a resonator toward the direction vertical to the substrate. This surface emitting semiconductor laser further includes first and second electrodes for injecting an electric current into the resonator. At least a part of the first electrode is formed on the upper surface of the resonator and includes an aperture in the resonator. The emitting surface is installed within the aperture. The reflectivity adjustment layer is formed on the emitting surface.

20 Claims, 14 Drawing Sheets

U.S. PATENT DOCUMENTS

2002/0127754 A1  9/2002  Kaneko et al.
2002/0191659 A1* 12/2002  Skogman .................... 372/46

FOREIGN PATENT DOCUMENTS

| JP | A 63-274187 | 11/1988 |
| JP | A 2000-22271 | 1/2000 |
| JP | A 2000-67449 | 3/2000 |
| JP | A 2001-156395 | 6/2001 |
| JP | A 2001-284722 | 10/2001 |
| JP | A 2001-284727 | 10/2001 |
| WO | WO 02/45217 A2 * | 6/2002 |

OTHER PUBLICATIONS

R. R. Schaefer; "Method for Fabricating Polymide Films"; XP-000806741; IBM Technical Disclosure Bulletin; vol. 25, No. 3A; Aug. 1982; pp. 1162-1163.

* cited by examiner

SURFACE EMITTING SEMICONDUCTOR LASER AND MANUFACTURING METHOD THEREOF, LIGHT MODULE, LIGHT TRANSMISSION DEVICE

BACKGROUND OF THE INVENTION

1. Field of Invention

The present invention relates to a surface emitting semiconductor laser, a manufacturing method thereof, a light module and a light transmission device including the surface emitting semiconductor laser.

2. Description of Related Art

A surface emitting semiconductor laser has a large amount of potential as a light source for optical communication and optical computing and various kinds of sensors. In the optical communication, a surface emitting semiconductor laser is currently tried to be applied to a light source for the short distance optical communication used with a multi modes fiber. Further, a surface emitting semiconductor laser will be applied as a light source for the long distance optical communication used with a single mode fiber in the future.

A transversal mode is a single mode (zero order fundamental mode), as a characteristic of a light source, which is suitable for a single mode fiber. Therefore, when applying a surface emitting semiconductor laser as a light source using a single mode fiber, a stabilized single mode is required.

As one of methods of obtaining light of a single mode with a surface emitting semiconductor laser, it is known that the current aperture is formed by selective oxidation and light is blocked at the same time of narrowing electric current by the current aperture. For example, in a surface emitting semiconductor laser composed of AlGaAs series, a layer having high composition ratio of aluminum can be formed in a multi-layered film mirror in advance and the side of this layer is oxidized thereafter so as to form the current aperture. This current aperture includes the region where composition ratio of Al remained in the center is high (an aperture) and an outskirt region including aluminum oxide (an oxidation blocking portion) which is formed around the above region. However, according to this method, there is a concern that the effect of blocking light is too large since the difference between a refractive index of the aperture and that of the oxidation-blocking portion is too large. Hence, it is desirable that the radius of the aperture is under 4 µm in order to obtain a stabilized single mode. However, in this case, there is the other concern that an element resistance is increased by restricting an electric current path in addition to deteriorating light emission efficiency.

SUMMARY OF THE INVENTION

The present invention is directed to provide a surface emitting semiconductor laser that is capable of controlling a stabilized transversal mode and a method of manufacturing thereof. In addition, the present invention can provide a light module and a light transmission device including the surface emitting semiconductor laser.

The first surface emitting semiconductor laser of the present invention can be a surface emitting semiconductor laser including a resonator formed on a substrate and emitting a laser beam toward a direction vertical to the substrate from the emitting surface formed on the upper surface of the resonator. The resonator can include a first mirror formed above the substrate, an active layer and a second mirror located oppositely to the first mirror with sandwiching the active layer. A reflectivity adjustment layer can be formed on the emitting surface; the second mirror includes a layer of which an optical thickness is $m_1 \lambda/2$ (m1, a natural number), when a wavelength of the laser beam is $\lambda$, and the optical thickness of the reflectivity adjustment layer is $(2 m_2 - 1)$ is $\lambda/4$ ($m_2$, a natural number).

In this application, an optical thickness is defined as a value obtained by dividing the refractive index from the actual thickness of the layer. For example, when a wavelength of a laser beam is $\lambda$, an optical thickness is $\lambda/2$ and a refractive index n is 1.4, the actual thickness of the layer is $\lambda/2 \times 1.4 = 0.7 \lambda$ since it is equal to an optical thickness x a refractive index "n". In addition, in the present application, it is assumed that thickness means the actual thickness. In addition, emitting light toward a direction vertical to a substrate means emitting light toward a direction vertical to the installed surface of the resonator.

According to the first surface emitting semiconductor laser of the present invention, the refractive index of the region including the reflectivity adjustment layer and a region of lower part of the reflectivity adjustment layer in the second mirror is smaller than the refractive index of other region.

In other words, when a region comprising the reflectivity adjustment layer and a region of lower part of the reflectivity adjustment layer in the second mirror is defined as a first region, other region except the first region in the second mirror is defined as a second region, the reflectivity of the laser beam in the first region can be larger than the reflectivity of the laser beam in the second region. Hence, the threshold value of a laser oscillation in the first region can be decreased comparing with that of the second region, such that light having stabilized transverse mode can be attained.

The second surface emitting semiconductor laser of the present invention can be a surface emitting semiconductor laser including a resonator formed on a substrate and emitting a laser beam toward a direction vertical to the substrate from the emitting surface formed on the upper surface of the resonator, comprising a first electrode and second electrode for injecting electric current into the resonator. At least a part of the first electrode can be formed on the upper surface of the resonator, an aperture is formed on the upper surface of the resonator, the emitting surface is formed within the aperture and the reflectivity adjustment layer is formed on the emitting surface.

According to the second surface emitting semiconductor laser of the present invention, at least a part of the first electrode can be formed on the upper surface of the resonator, an aperture is formed on the upper surface of the resonator, and the reflectivity adjustment layer is formed on the emitting surface installed within the aperture. Hence, the layer for the first electrode is differentiated from the reflectivity adjustment layer, enabling the configuration and size of the first electrode to be formed independently from that of the reflectivity adjustment layer so as to enhance versatility of element design.

In this case, the resonator can include a first mirror formed above the substrate, an active layer, and a second mirror located oppositely to the first mirror with sandwiching the active layer. Reflectivity of the laser beam in a first region is larger than reflectivity of the laser beam in a second region, when the first region is defined as a region comprising the reflectivity adjustment layer and a lower region of the reflectivity adjustment layer in the second mirror, and the second region is defined as a region except the first region in the second mirror. Hence, the threshold of laser oscillation in the first region can be decreased comparing with that in the second region so as to attain light having a stabilized transverse mode.

Further, in this case, when a wavelength of the laser beam is $\lambda$, the second mirror includes a layer of the optical thickness; $m_1 \lambda/2$ ($m_1$, natural number), and the optical thickness of the reflectivity adjustment layer can be $(2 m_2-1) \lambda/4$ ($m_2$, natural number). According to this constitution, the reflectivity of a region including the reflectivity adjustment layer and the lower part of the reflectivity adjustment layer in the second mirror can be increased so as to efficiently decrease the threshold of laser oscillation in this region. Accordingly, light of having a stabilized transverse mode can be obtained.

The first and second surface emitting semiconductor lasers of the present invention may include the following aspects (1) to (7).

(1) The layer of which optical thickness is $m_1 \lambda/2$ may be formed on the most upper layer of the second mirror. According to this constitution, reflectivity in the first region can be raised effectively so as to obtain light having stabilized transverse mode.

(2) The reflectivity adjustment layer may be optically transparent to the laser beam. According to this constitution, it can be possible to emit a laser beam efficiently so as to obtain a surface emitting semiconductor laser with high efficiency, which can control a mode.

(3) The plane configuration of the reflectivity adjustment layer can be a circle. In this case, the diameter of the reflectivity adjustment layer is equal to or less than 6 μm. According to this structure, it is uneasy to generate a laser beam with high order modes so as to obtain a stabilized laser having a single mode more easily. Hence, this can be applied to a light source for optical communication with using a single mode for example. In addition, in this case, the emitting surface is circular, and the reflectivity adjustment layer is installed coaxially with the center axis of the emitting surface. According to this constitution, stabilized light having circular transverse mode can be obtained.

(4) The reflectivity adjustment layer may be composed of a resin hardened by heat or a resin hardened by an ultraviolet ray.

(5) The thickness of the reflectivity adjustment layer may not be fixed. In this case, the thickness of the reflectivity adjustment layer can be increased in the neighbor of a contact surface with the first electrode.

(6) Furthermore, the second mirror may be provided with a current aperture having concentric circle-shaped plane, and the area of the inside circle of the current aperture is larger than the sectional area of the reflectivity adjustment layer. According to this structure, the resistive value of the element caused by the current aperture can be decreased so as to enhance light emission efficiency. Furthermore, forming the current aperture can control an electric current path independently from controlling the transverse mode. As a result, a surface emitting semiconductor laser having high efficiency and superior reliability can be obtained.

(7) The resonator can include a column-like part at least in one part.

A first method of manufacturing a surface emitting semiconductor laser of the present invention, including a resonator formed on a substrate and emitting a laser beam toward a direction vertical to the substrate from the emitting surface formed on the upper surface of the resonator, can include forming a resonator on the substrate, forming a first mirror formed above the substrate, an active layer and a second mirror located oppositely to the first mirror with sandwiching the active layer in the resonator, and forming a layer of which optical thickness is $m_1 \lambda/2$ ($m_1$, a natural number) in the second mirror. The method can further include forming a reflectivity adjustment layer of which optical thickness is $(2 m_2-1) \lambda/4$ ($m_2$, a natural number).

According to the first method of manufacturing a surface emitting semiconductor laser of the present invention, a surface emitting semiconductor laser, which can control a transverse mode with stability, can be manufactured more easily.

In this case, forming a reflectivity adjustment layer may include forming a precursor of the reflectivity adjustment layer with ejecting a droplet onto the emitting surface by an ink-jet method, and hardening the precursor thereafter to form the reflectivity adjustment layer on the emitting surface. Here, the precursor is composed of a material, which is hardened by irradiating an energy beam such as a resin hardened by heat or a resin hardened by an ultraviolet ray.

According to this method, the reflectivity adjustment layer can be formed by an ink jet method, such that any damage to an device can be decreased comparing with a CVD method, evaporation and etching for forming the reflectivity adjustment layer and the reflectivity adjustment layer can be formed easily. In addition, when forming the reflectivity adjustment layer by an ink-jet method, the thickness of the reflectivity adjustment layer can be easily adjusted with high precision by adjusting an amount of a droplet. In addition, in this case, the layer of which optical thickness is $m_1 \lambda/2$ can be formed on the most upper layer of the second mirror.

The second method of manufacturing a surface emitting semiconductor laser of the present invention, including a resonator formed on a substrate and emitting a laser beam toward a direction vertical to the substrate from the emitting surface formed on the upper surface of the resonator, can include forming a resonator on the substrate, forming a first electrode and a second electrode to inject a current into the resonator, wherein at least a part of the first electrode is formed on the upper surface of the resonator and an aperture is formed on the upper surface of the resonator, and forming the reflectivity adjustment layer on the emitting surface.

According to the second method of manufacturing a surface emitting semiconductor laser of the present invention, a surface emitting semiconductor laser, which can control a transverse mode with stability, can be manufactured more easily.

In this case, forming the reflectivity adjustment layer may include forming a precursor of the reflectivity adjustment layer with ejecting a droplet onto the emitting surface by an ink-jet method, and hardening the precursor thereafter to form the reflectivity adjustment layer on the emitting surface.

Here, the precursor may be composed of a material, which is hardened by irradiating an energy beam, such as a resin hardened by heat or a resin hardened by an ultraviolet ray.

This method has the same functions and effects of forming the reflectivity adjustment layer by using an ink jet method, which have been described in the section of the first method of manufacturing a surface emitting semiconductor laser.

Further, in this case, forming a resonator can include forming a resonator on the substrate, including a first mirror formed above the substrate, an active layer and a second mirror located oppositely to the first mirror with sandwiching the active layer in the resonator and forming a layer of which optical thickness is $m_1 \lambda/2$ ($m_1$, a natural number) in the second mirror. Also, forming the reflectivity adjustment layer can include forming a reflectivity adjustment layer of which optical thickness is $(2 m_2 -1) \lambda/4$ ($m_2$, a natural number). Furthermore, in this case, the layer of which the optical thickness is $m_1 \lambda/2$, can constitute the top layer of the second mirror.

The surface emitting semiconductor laser of the present invention can be applied to a light module including a light wave-guide. In addition, it can be applied to a light transmission device including the light module.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Preferred embodiments of the present invention are described with referring to the accompanying drawings as follows.

Figure 1:
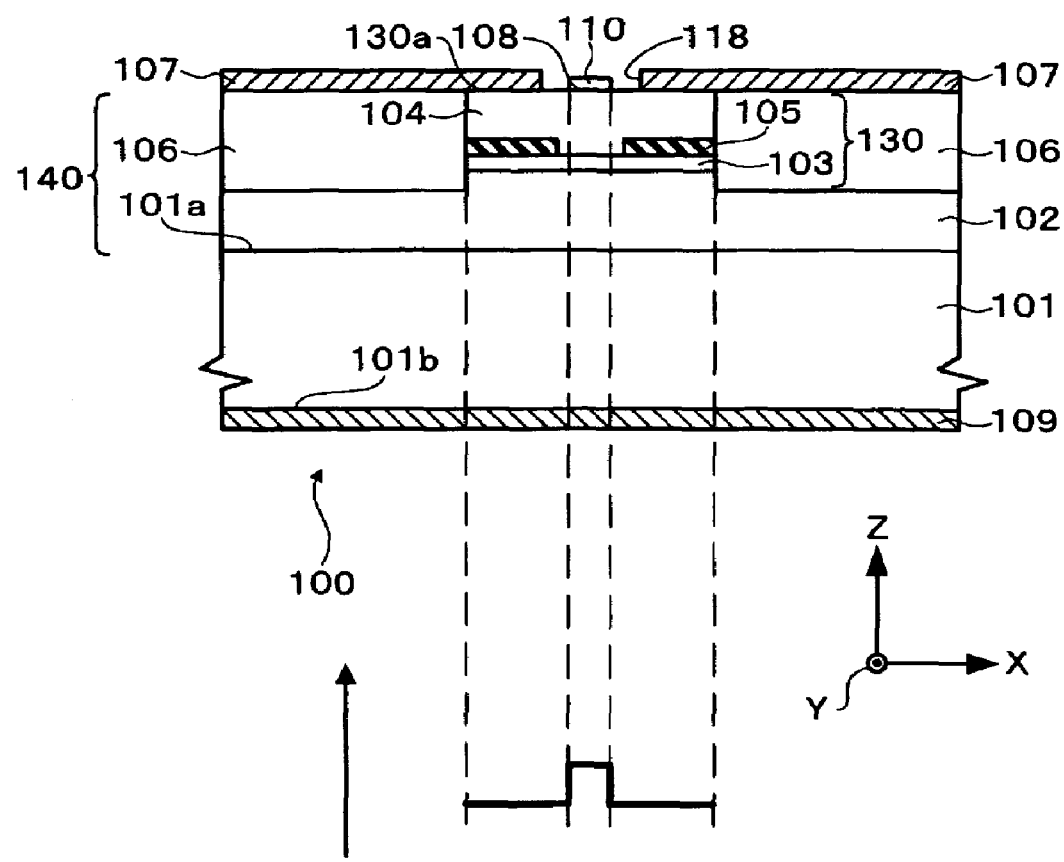
FIG. 1 is a sectional and schematical view of a surface emitting semiconductor laser related to the first embodiment to which the present invention is applied.
Figure 2:
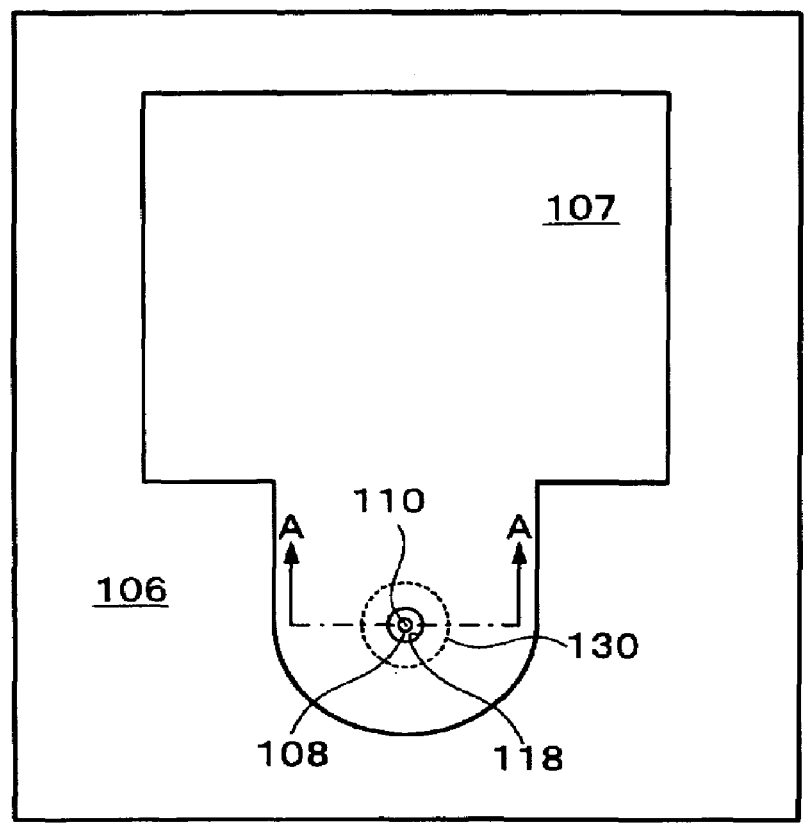
FIG. 2 is a plane view showing the surface emitting semiconductor laser related to the first embodiment to which the present invention is applied.
Figure 2:
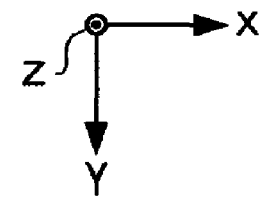

FIG. 1 is a sectional view schematically showing a surface emitting semiconductor laser (a surface-emitting laser) 100 of the first embodiment to which the present invention is applied. FIG. 2 is a plane view of showing the surface-emitting laser 100 schematically. FIG. 1 is a figure, which shows a section along the A-A line of FIG. 2.

The surface-emitting laser 100 of the present embodiment can include a substrate 101 (n-type GaAs substrate in this embodiment) and a vertical resonator 140 (resonator) formed on the substrate 101, as shown in FIG. 1. The surface-emitting laser 100 can emit a laser beam from the emitting surface 108, which is formed on the upper surface of the resonator 140 toward a direction vertical to the substrate 101.

Next, each of constituents of this surface emitting semiconductor laser 100 is described.

In this embodiment, the resonator 140 includes a column-like semiconductor stacked layer 130 (referred to as column-like portion) and the side of the column-like portion 130 is covered by an insulating layer 106. The column-like portion 130 can be formed in the resonator 140. Here, the column-like portion 130 is one part of the resonator 140 and include at least a second mirror 104. This column-like portion 130 is buried with an insulation layer 106. In other words, the side of the column-like portion 130 is surrounded with the insulation layer 106. Furthermore, the first electrode 107 is formed on the column-like portion 130.

The resonator 140 can include for example, a distributive reflection-type multi layered mirror 102 (referred to as a first mirror hereafter), formed by depositing 40 pairs of an n-type $Al_{0.9}Ga_{0.1}As$ layer with an n-type $Al_{0.15}Ga_{0.85}As$ layer each other, an active layer 103 including a quantum well structure constituted by triple GaAs well layers and a $Al_{0.3}Ga_{0.7}As$ barrier layer, and a distributive reflectio p-type multi layered mirror 104 (referred to as a second mirror hereafter), formed by depositing 25 pairs of an p-type $Al_{0.9}Ga_{0.1}As$ layer with an p-type $Al_{0.15}Ga_{0.85}As$ layer alternately, which are deposited sequentially in this order. Further, the composition and numbers of layers in the first mirror 102, the active layer 103 and the second mirror 104 are not limited to the above description.

Each of layers constituting the first mirror has the optical thickness (the thickness of the direction in parallel to Z direction shown in FIG. 1) which is odd number times of $\lambda/4$ (for example, $\lambda/4$) when the wavelength of a laser beam emitted from the emitting surface 108 is $\lambda$.

In addition, the second mirror 104 includes a layer of which the optical thickness is $m_1 \lambda/2$ ($m_1$, natural number), and each of layers except this layer, including the second mirror 104 has the optical thickness which is the odd number times of $\lambda/4$ (for example, $\lambda/4$). In the present embodiment, it is described a case when a layer of which optical thickness is $m_1 \lambda/2$ ($m_1$, natural number), is the top layer in the second mirror 104.

Impurity of the second mirror 104 is p-type by doping C, for example, impurity in the first mirror 102 is n-type by doping Si, for example. Therefore, a pin diode is formed with the second mirror 104, the non-doped active layer 103 and the first mirror 102.

In addition, according to the present embodiment, a portion on the way to the first mirror 102 from the side of emitting a laser beam of this surface emitting semiconductor laser 100 among the resonator 140 is etched as circular shape viewed from the side of emitting a laser beam so as to form the column-like portion 130.

In addition, in this embodiment, a plane shape of this column-like portion 130 is a circle. But, arbitrary shapes for this portion can be available.

Furthermore, in the region that is near to the active layer 103 among layers constituting the second mirror 104, a current aperture 105 composed of an aluminum oxide can be formed. This current aperture 105 is formed as a ring-shaped. Namely, this current aperture 105 is a concentric circle-shaped plane shape. In other words, a section, when this current aperture 105 is cut along a plane in parallel with a X-Y plane in FIG. 1, is a concentric circle-shaped.

An area of the inside circle of the current aperture 105 can be made larger than sectional area of a reflectivity adjustment layer 110 (described below). According to this structure, the resistive value of an element caused by current aperture 105 can be made small so as to enhance light emission efficiency. Furthermore, the current aperture 105 is formed so as to control a current path independently from controlling a transverse mode. As a result, the surface emitting semiconductor laser with high efficiency and high reliability can be obtained.

In addition, in the surface-emitting laser 100, related to the preferred embodiment, the insulation layer 106 can be formed to cover the side surface of the column-like portion 130 and over the upper surface of the first mirror 102.

In a process of manufacturing the surface-emitting laser 100, the insulation layer 106 is formed to cover the side surface of the column-like portion 130. Subsequently, the first electrode 107 is formed on the upper surface of the column-like portion 130 and the upper surface of the insulating layer 106. The second electrode 109 is formed on the backside surface 101b of the substrate 101. In the process of forming these electrodes, anneal treatment is generally implemented about 400° C. (Refer to a manufacturing process described below). Therefore, when the insulation layer 106 can be formed with a resin, it is necessary that the resin for forming the insulation layer 106 is superior in thermal proof in order to endure the annealing process. In order to satisfy this requirement, it is desirable that a resin for forming the insulation layer 106 is a polyimide resin, a fluorine group resin, an acrylic acid resin or an epoxy resin. Especially, a polyimide resin is more desirable viewed from easiness in processing and insulation.

The first electrode 107 and the second electrode 109 are arranged in order to inject a current into the resonator 140. In detail, a current is injected into the active layer 103 by the first electrode 107 and the second electrode 109.

At least a part of the first electrode 107, as shown in FIG. 1 is formed on the upper surface of the column-like portion 130. In detail, the first electrode 107 is formed on upper surface of the column-like portion 130 and the insulation layer 106. The first electrode 107 can be formed with a multi-layered film such as an alloy of Au and Zn and Au, for example.

In addition, the first electrode 107 has an aperture 118 in the upper surface 130a of the resonator 130. In other words, in the central portion of the upper surface 130a of the column-like portion 130, a part (the aperture 118) where the first electrode 107 is not formed, is installed. An emitting surface 108 is formed within the aperture 118. This emitting surface 108 is for emitting a laser beam.

In the surface-emitting laser 100 of the present embodiment, the emitting surface 108 is a circle.

Furthermore, in the backside 101b of the substrate 101, the second electrode 109 is formed. In other words, the surface-emitting laser 100 shown in FIG. 1, is connected to the first electrode 107 on the column-like portion 130 and connected to the second electrode 109 at the backside 101b of the substrate 101. The second electrode 109 can be formed with a multi layered film such as an alloy of Au and Ge and Au, for example.

A reflectivity adjustment layer 110 is formed on the emitting surface 108. The plane configuration of the reflectivity adjustment layer 110 can be a circle. In this case, a diameter of the reflectivity adjustment layer 110 can be less than 6 μm. According to this structure, it is not easy to generate a laser beam with high order mode such that a stabilized laser beam with single mode can be easily obtained. Hence, this can be applied to a light source with a single mode fiber for optical communication. In addition, in this case, the central axis of the reflectivity adjustment layer 110 can be installed coaxially with the central axis of the emitting surface 108. According to this constitution, a stabilized laser beam with circular transverse mode can be obtained.

In addition, this reflectivity adjustment layer 110 can be formed with a material transparent to a laser beam emitted from the emitting surface 108. Hence, the reflectivity adjustment layer 110 is composed of a material transparent to a laser beam enabling a laser beam to emit more efficiently. Thus, the surface emitting semiconductor laser with high efficiency, which can control modes, can be obtained.

The reflectivity adjustment layer 110 is composed of a liquid material for example, which can be hardened by adding energy such as heat, light and others (a resin hardened by an ultraviolet ray, or a resin hardened by heat, for example). As a resin hardened by an ultraviolet ray, an acrylic group resin and an epoxy group resin, which are hardened by an ultraviolet ray, are cited, for example.

In addition, as a resin hardened by heat, a precursor of a polyimide group resin hardened by heat can be cited. A resin hardened by an ultraviolet ray is hardened by irradiating an ultraviolet ray during short time. Hence, it can be hardened without a process that may give any damages to an element, such as a thermal process. Therefore, when forming the reflectivity adjustment layer 110 by using an ultraviolet ray hardened resin, influence given to an element can be reduced.

In addition, the optical thickness "$d_r$" (see FIG. 3) of this reflectivity adjustment layer 110, is $(2 m_2-1) \lambda/4$ ($m_2$, natural number).

Figure 3:
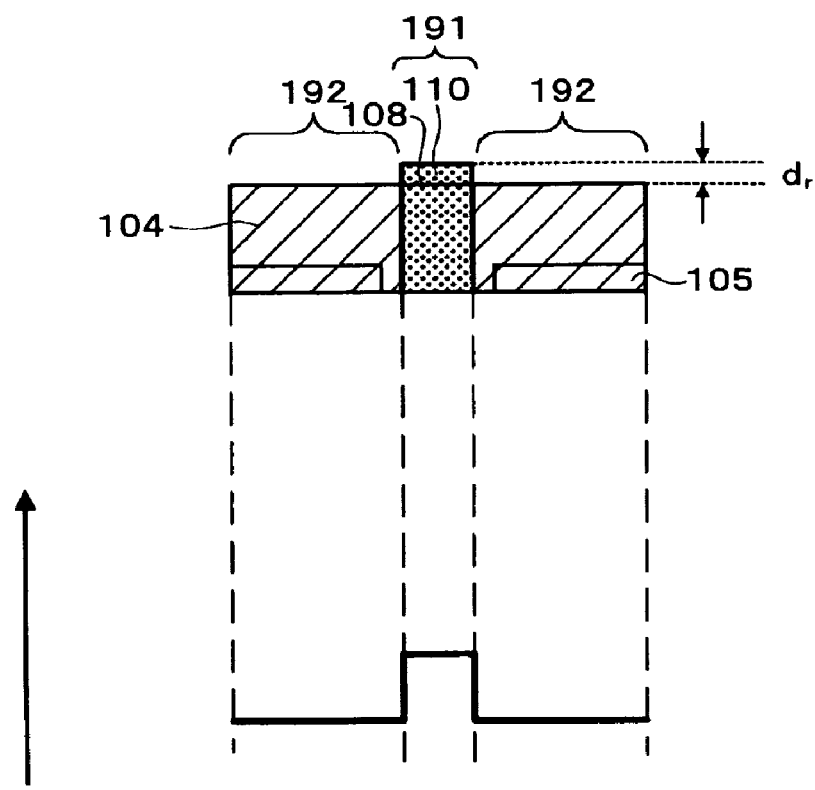
FIG. 3 is an expanded sectional and schematical view of the second mirror shown in FIG. 1.

FIG. 1 shows a sectional profile of reflectivity of the second mirror 104 along with the surface-emitting laser 100. In addition, FIG. 3 shows an expanded sectional view of the neighborhood of the second mirror 104 in FIG. 1. As shown in FIG. 3, a region including the reflectivity adjustment layer 110 and the lower portion of the reflectivity adjustment layer 110 in the second mirror 104 are defined as a first region 191 and other region except the first region 191 is defined as a second region 192. In detail, FIG. 3 shows a region indicated by half-tone dot meshing as the first region 191 and a region indicated by slanted lines as the second region 192. Here, the reflectivity of a laser beam in the first region 191 is larger than the reflectivity of a laser beam in the second region 192. FIG. 1 and FIG. 3 show a distribution of reflectivity in each of the first region 191 and in the second region 192. In FIG. 1 and FIG. 3, the reflectivity is increased with going forward to the arrowed direction.

As described above, the second mirror 104 includes a layer of which optical thickness is $m_1 \lambda/2$ and each of layers except this layer can include the second mirror 104 has the optical thickness, which is odd number times of $\lambda/4$. If the above case when the second mirror 104 includes a layer of which optical thickness is $m_1 \lambda/2$ and each of layers except this layer including the second mirror 104 has the optical thickness, which is odd number times of $\lambda/4$ as the surface-emitting laser 100 of the present embodiment, is compared with a case when the optical thickness of all layers comprising the second mirror 104 is odd number times of $\lambda/4$, the reflectivity of the second mirror 104 in the above case is low. However, in this case, the reflectivity of the first region 191 can be increased by forming the reflectivity adjustment layer 110 of which optical thickness is $(2 m_2-1) \lambda/4$. Hence, the reflectivity of a laser beam in the first region 191 can be larger than the reflectivity of a laser beam in the second region 192. As a result, the first region 191 can generate laser oscillation more efficiently than the second region 192 enabling light with a single mode to be obtained efficiently.

General operation of the surface-emitting laser 100 of the present embodiment is shown in the following. Here, the following method of driving the surface-emitting semiconductor laser is merely one example, and it should be understood that various kinds of modifications are available within the sprit and scope of the present invention.

At first, when voltage of a forwarded direction is applied to a pin diode via the first electrode 107 and the second electrode 109, electrons are re-combined with positive holes in the active layer 103 so as to generate light emission related to this re-combination. Thus, induced emission occurs when a generated light beam goes back and forth between the second mirror 104 and the first mirror 102 so as to amplify light intensity. When optical gain surpasses optical loss, laser oscillation occurs so as to emit a laser beam toward a direction vertical to the substrate 101 (a Z-direction in FIG. 1) from the emitting surface 108 on the column-like portion 130 via the reflectivity adjustment layer 110. Here, a direction vertical to the substrate 101 means a direction (a Z-direction in FIG. 1) vertical to the surface 101a (a plane parallel to a X-Y plane in FIG. 1) of the substrate 101.

Next, an example of a method for manufacturing the surface-emitting laser 100 regarding to the first embodiment is described referring to FIG. 4 to FIG. 10. FIG. 4 to FIG. 10 show sectional views schematically of a process for manufacturing the surface emission semiconductor laser 100 of the present embodiment and are corresponding to a sectional view in FIG. 1.

Figure 4:
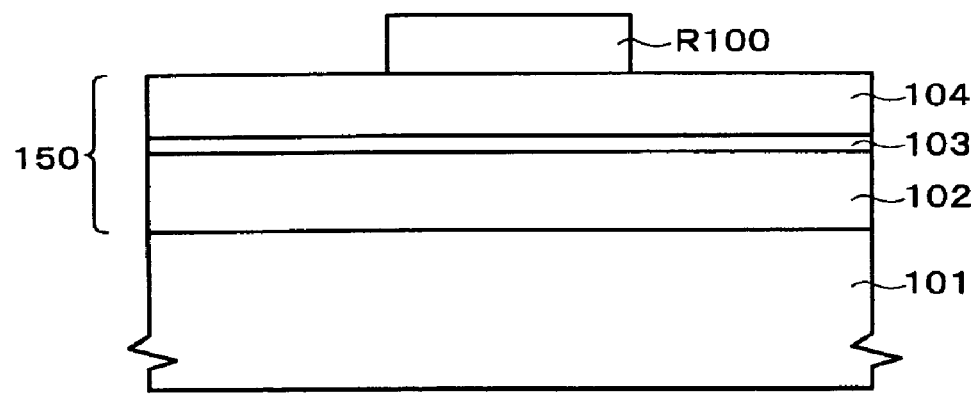
FIG. 4 is a sectional and schematical view showing a process for manufacturing the surface emitting semiconductor laser shown in FIG. 1 to FIG. 3.

At first, a semiconductor multi-layered film 150 is formed on the substrate 101 composed of n-type GaAs by epitaxial growth with modulating a composition (see FIG. 4). Here, a semiconductor multi-layered film 150 comprises, for example, the first mirror 102, formed by depositing 40 pairs of an n-type $Al_{0.9}Ga_{0.1}As$ layer and an n-type $Al_{0.15}Ga_{0.85}As$ layer each other, the active layer 103 including a quantum well structure constituted by triple GaAs well layers and a $Al_{0.3}Ga_{0.7}As$ barrier layer, and the second mirror 104, formed by depositing 25 pairs of an p-type $Al_{0.9}Ga_{0.1}As$ layer and an p-type $Al_{0.15}Ga_{0.85}As$ layer alternately. At this time, only the top layer of the second mirror 104 is grown in order that its optical thickness becomes $m_1 \lambda/2$. The optical thickness of each of layers constituting the first mirror 102 and the second mirror 104 is odd number times of $\lambda/4$, except the top layer of the second mirror 104. These layers are accumulated in order on the substrate 101 so as to form the semiconductor multi-layered film 150. Here, when growing the second mirror 104, at least one layer close to the active layer 103 is formed as an AlAs layer or an AlGaAs layer that Al composition is more than 0.95 (the layer of a high Al composition). This layer is oxidized later to be the current aperture 105. In addition, it is desirable that carrier density is increased so as to have an ohmic contact with an electrode (the electrode 107 described hereafter) in the top surface layer of the second mirror 104.

Temperature for epitaxial growth is determined appropriately by growth methods, raw materials, a kind of the substrate 101 or a kind of the semiconductor multi-layered film 150, its thickness and carrier density. But in general, it is desirable to be the range of 450° C. to 800° C. In addition, time for epitaxial growth is also determined appropriately as well as temperature. As a method of epitaxial growth, Metal-Organic Vapor Phase Epitaxy (MOVPE) a MBE method (Molecular Beam Epitaxy) or a LPE method (Liquid Phase Epitaxy) can be used.

Figure 5:
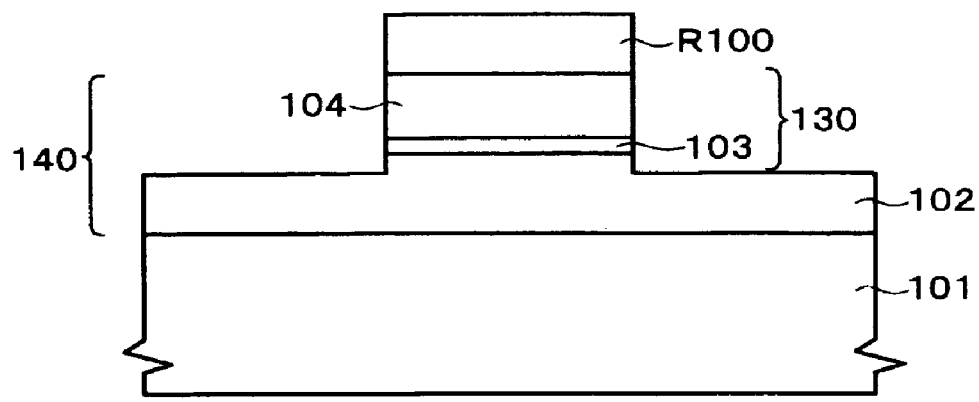
FIG. 5 is a sectional and schematical view showing a process for manufacturing the surface emitting semiconductor laser shown in FIG. 1 to FIG. 3.

Subsequently, a column-like portion 130 is formed (see FIG. 5). In detail, after a photo resist is coated over the semiconductor multi-layered film 150 (not shown in a FIG.), the photo resist is patterned by the photolithographic method so as to form a predetermined patterned resist layer R100. Further, for example, the second mirror 104, the active layer 103 and a part of the first mirror 102 are etched by a dry etching method, for example, with the resist layer R100 as a mask to form the column-like semiconductor stacked layer (the column-like portion) 130. Based on the above-mentioned manufacturing process, the resonator 140 including the column-like portion 130 is formed on the substrate 101, as shown in FIG. 5. The resist layer R100 is removed afterwards.

Figure 6:
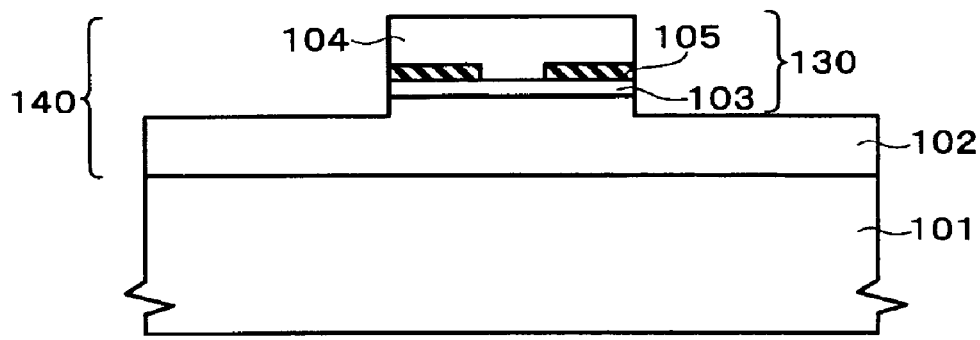
FIG. 6 is a sectional and schematical view showing a process for manufacturing the surface emitting semiconductor laser shown in FIG. 1 to FIG. 3.

Subsequently, current aperture 105 is formed if it necessary (see FIG. 6). In detail, as shown in FIG. 6, the substrate 101, provided with the resonator 140 formed by the above process, is introduced into a steam atmosphere of around 400° C., for example, oxidizing a layer where Al composition is high in the above-mentioned second mirror 104. Hence, the current aperture 105 can be formed. An oxidation rate depends upon temperature of a furnace, quantity of steam supply, Al composition and thickness of the layer to be oxidized (the layer of high Al composition). In the surface-emitting laser provided with the current aperture formed by the oxidation, a current flows only in a part where the current aperture is not formed (not oxidized), when this laser is activated. Therefore, in a process of forming the current aperture by oxidation, current density can be controlled by controlling the range of the current aperture 105 to be formed.

Figure 7:
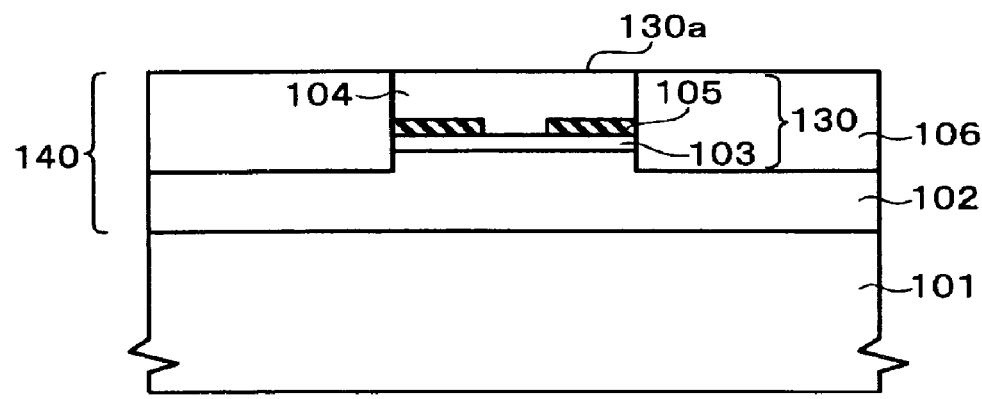
FIG. 7 is a sectional and schematical view showing a process for manufacturing the surface emitting semiconductor laser shown in FIG. 1 to FIG. 3.

Subsequently the insulation layer 106 surrounding the column-like portion 130 is formed (see FIG. 7). Here, a case using a polyimide resin as a material for forming the insulation layer 106 is described. At first, a precursor of a resin (a precursor of a polyimide) is coated over the resonator 140 by a spin coat method, for example, to form a precursor layer of a resin (not shown). In this case, it is formed such that the thickness of the precursor layer of a resin is larger than the height of the column-like portion 130. In addition, as a method of forming the precursor layer of a resin, conventional technologies such as the above mentioned spin coating method, a dipping method, a spray coating method, and an ink jet method are applied.

Subsequently, after this substrate is heated by a hot plate, for example, to remove a solvent, the upper surface 130a of the column-like portion 130 (see FIG. 7) is exposed. As a method of exposing the upper surface 130a of the column-like portion 130, a CMP method, a dry etching method, and a wet etching method can be utilized. Then, the insulation layer 106 is formed by making the precursor layer of a resin to be imide under a furnace with 350° C. Here, the upper surface 130a of the column-like portion 130 may be exposed by etching a insulating layer which is mostly hardened via a process for making it to be imide.

Figure 8:
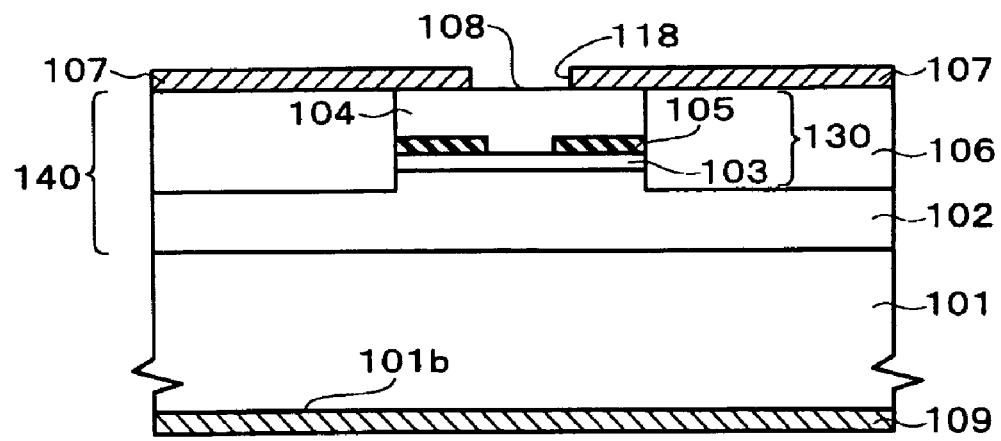
FIG. 8 is a sectional and schematical view showing a process for manufacturing the surface emitting semiconductor laser shown in FIG. 1 to FIG. 3.

Next, the first electrode 107 and the second electrode 109 for injecting current into the active layer 103 and the surface for emitting a laser beam 108 are formed (see FIG. 8). At first, the upper surface 130a of the column-like portion 130 is cleaned by a plasma processing method and others, before forming the first electrode 107 and the second electrode 109. Hence, a device having more stabilized characteristics can be formed. Subsequently, a multi-layered film such as an alloy of Au and Zn and Au, for example, (not shown) is formed on the insulating layer 106 and the upper surface 130a of the column-like portion 130 (see FIG. 7) by a vacuum evaporation method. In this case, an Au layer is formed on the top surface. Subsequently, a part where the above multi-layered film is not formed is formed on the upper surface 130a of the column-like portion 130 by a lift off method. This part becomes the aperture 118 (see FIG. 8).

The emitting surface 108 is installed within the aperture 118. In other words, the region located within the aperture 118 among the upper surface 130a of the column-like portion 130 functions as the emitting surface 108. In addition, in the above manufacturing process, a dry etching method can be used instead of a lift off method.

In addition, for example, a multi-layered film, such as an alloy of Au and Ge and Au, for example, (not shown) is formed at the backside 101b of the substrate 101, is formed by a vacuum evaporation method, for example. Subsequently, this film is annealed. Temperature of annealing depends upon electrode materials. In that case of electrode materials used in the present embodiment, it is normally annealed around 400° C.

Subsequently, the reflectivity adjustment layer 110 is formed on the emitting surface 108 (see FIG. 9 and FIG. 10). In detail, at first, a resist layer R200 is formed by a photolithographic method within the aperture 118. This resist layer R200 has an aperture 218. This aperture 218 is used to form the reflectivity adjustment layer 110. In detail, the aperture 218 has a circular shaped plane of which central axis is coincided with the central axis of the aperture 118.

Subsequently, a droplet is charged onto the aperture 218 by an ink jet method to form a precursor 110b (see FIG. 10) of the reflectivity adjustment layer 110 (see FIG. 1 to FIG. 3). Then, this precursor 10b is hardened so as to form the reflectivity adjustment layer 110 on the emitting surface 108b. Here, the precursor 110b is composed of a material which is hardened by energy beam such as a resin hardened by heat or a resin hardened by a ultraviolet ray, for example.

As an ejecting method of an ink jet, for example, there are (i) a method of ejecting a liquid under a pressure caused by changing the size of an air bubble in a liquid (a lens material here) with heating and (ii) a method of ejecting a liquid under a pressure caused by a piezo electric device. Viewed from controlling pressure, the (ii) method is desirable.

Alignment of a position of a nozzle 112 of an ink-jet head 120 with a position of ejecting a droplet 110a is implemented by a conventional image recognition technology used in an exposure process or a test process in general processed for manufacturing a semiconductor integrated circuit. For example, as shown in FIG. 9, alignment of the position of the nozzle 112 of the ink-j et head 120 with the aperture 118 of the surface-emitting laser 100 is implemented by image recognition. After alignment, the voltage applied to the ink-jet head 120 is controlled. Then, the droplet 110a is discharged. Hence, the precursor 10b is formed on the emitting surface 108 (see FIG. 10).

In this case, there is fluctuation of angles of ejecting the droplet 110a from the nozzle 112 in some degree. However, if the position where the droplet 110a impacts is the inside of the aperture 118, the droplet 110a is spread out with wet in the region surrounded by the resist layer R200 and the position is corrected automatically thereby.

Figure 10:
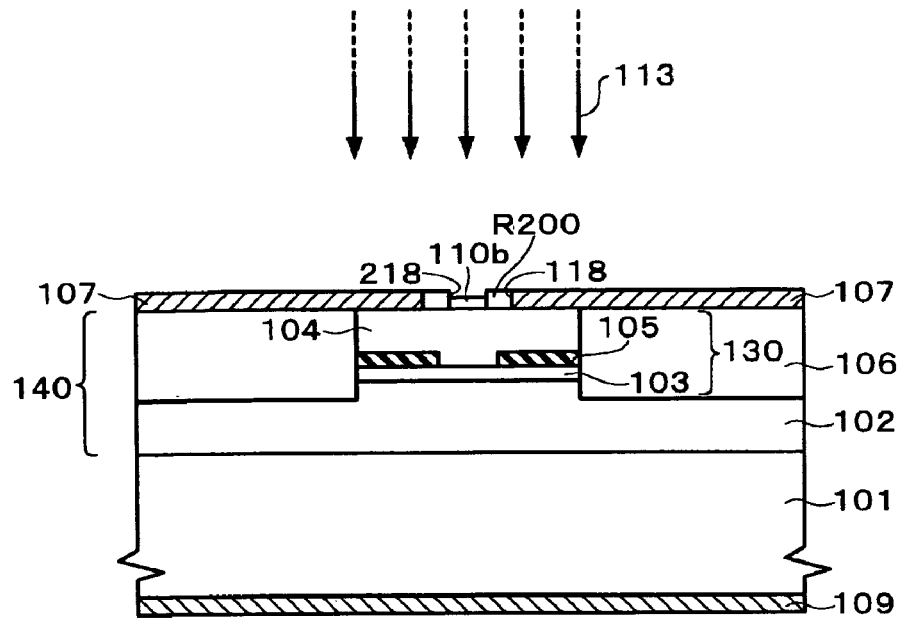
FIG. 10 is a sectional and schematical view showing a process for manufacturing the surface emitting semiconductor laser shown in FIG. 1 to FIG. 3.

After completing the above process, as shown in FIG. 10, energy beams 113 (ultraviolet rays, for example) are irradiated to harden the precursor 110b. The reflectivity adjustment layer 110 is formed on the emitting surface 108 (see FIG. 1 to FIG. 3). An appropriate amount of irradiation and a wavelength of an ultraviolet ray depend upon materials of the precursor 10b. For example, when the precursor 110b is formed using by an acrylic group resin hardened by an ultraviolet ray, this precursor is hardened by irradiating an ultraviolet ray of the wavelength; 350 nm and strength; 10 mW onto it during five minutes. The resist layer R200 is removed afterwards.

The surface-emitting laser 100 shown in FIG. 1 to FIG. 3 is provided by the above-mentioned processes.

The surface-emitting laser 100 with respect to the present embodiment has the following advantages and functions.

Reflectivity of a region including the reflectivity adjustment layer 110 and the lower part region of the reflectivity adjustment layer 110 in the second mirror 104 is smaller than that of a region except this region. In detail, when a wavelength of a laser beam is $\lambda$, since the second mirror 104 includes a layer of which optical thickness is $m_1$ $\lambda/2$ and the optical thickness of the reflectivity adjustment layer 110 (2 $m_2$−1) is $\lambda/4$, the reflectivity of a laser beam in the first region 191 can be larger than that in the second region 192 (see FIG. 3). Hence, the threshold of laser oscillation in the first region 191 can be decreased comparing with the second region 192, enabling stable light with transverse mode to be obtained. In particular, a layer of which optical thickness is $m_1$ $\lambda/2$, constitutes the top layer of the second mirror 104, enabling the reflectivity in the first region 191 to be increased efficiently and stable light with transverse mode to be obtained surely.

At least one part of the first electrode 107 can be formed on the upper surface 130a of the resonator 130, the aperture 118 is formed on the upper surface 130a of the resonator 130 and the reflectivity adjustment layer 110 is formed on the emitting surface 108 installed within this aperture 118. In other words, since a layer for the first electrode 107 is differentiated from the reflectivity adjustment layer 110, the configuration and the size of the first electrode 107 can be formed independently from that of the reflectivity adjustment layer 110, enabling a device design to be versatile.

The reflectivity adjustment layer 110 is composed of a resin hardened by heat or a resin hardened by an ultraviolet ray. In addition, this reflectivity adjustment layer 110 can be formed by an ink-jet method.

The reflectivity adjustment layer 110 is formed by an ink-jet method such that damage applied to a device can be reduced comparing with forming the reflectivity adjustment layer 110 by the CVD method, evaporation and etching and the reflectivity adjustment layer 110 can be easily formed. In addition, when forming the reflectivity adjustment layer 110 by an ink-jet method, an amount of droplets is adjusted so as to control the thickness of the reflectivity adjustment layer 110 easily with high precision.

Figure 11:
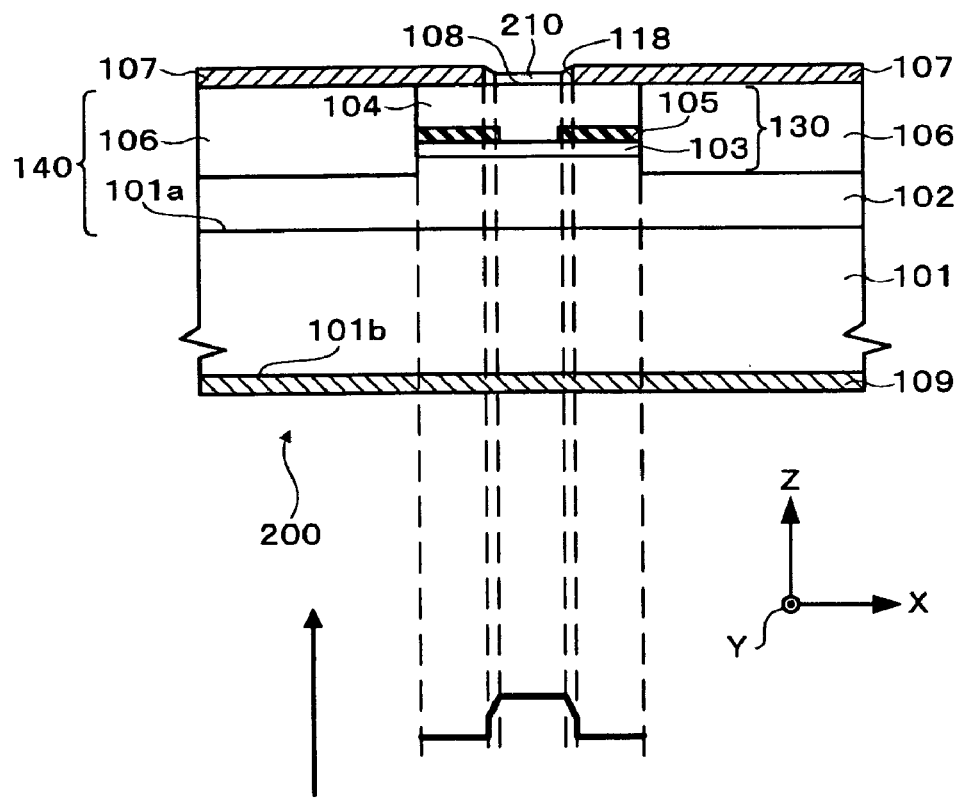
FIG. 11 is a sectional and schematical view showing a surface emitting semiconductor laser related to the second embodiment to which the present invention is applied.
Figure 12:
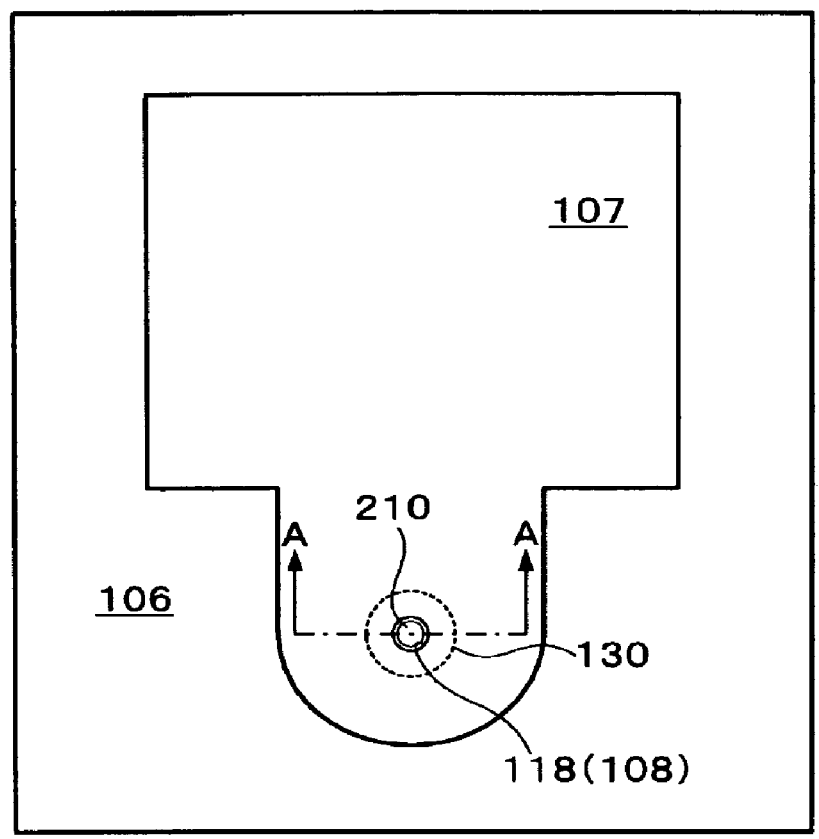
FIG. 12 is a sectional and schematical view showing a surface emitting semiconductor laser related to the second embodiment to which the present invention is applied.
Figure 12:
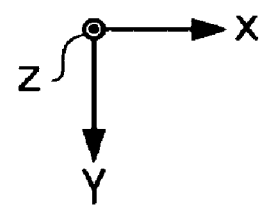

FIG. 11 shows a schematically sectional view of the surface-emitting laser 200 of the second embodiment to which the present invention is applied. FIG. 12 shows a schematically plane view of the surface-emitting laser 200 of the second embodiment to which the present invention is applied. FIG. 11 is a figure showing a section along the A—A line of FIG. 12.

The surface-emitting laser 200 of the embodiment has mostly the same structure of surface-emitting laser 100 of the first embodiment except a constitution where the reflectivity adjustment layer 210 is formed entirely over the aperture 118 of the first electrode 107. The same reference numbers are referred to structural elements having the substantially same function in the same structure of the surface-emitting laser 100 of the first embodiment and the detailed description is omitted.

Figure 13:
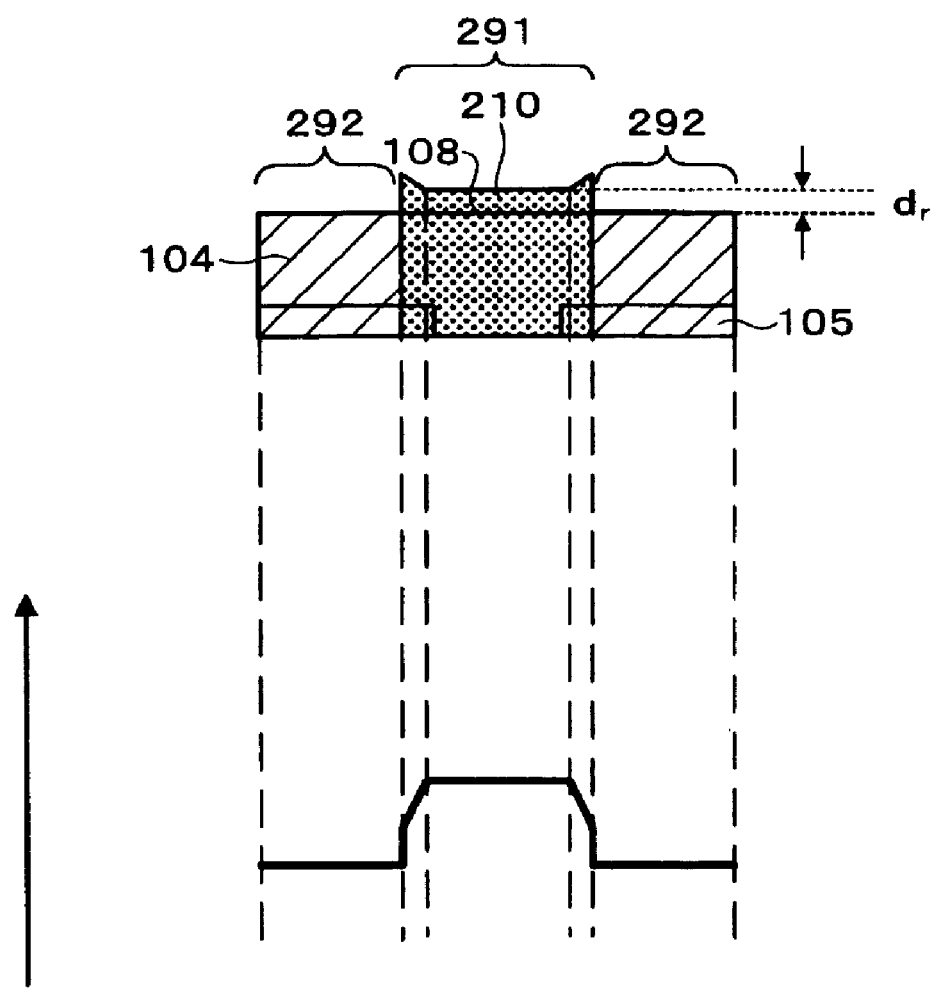
FIG. 13 is an expanded sectional and schematical view showing the second mirror shown in FIG. 11.

FIG. 11 shows a sectional profile of reflectivity of the second mirror 104 along with the surface-emitting laser 200. In addition, FIG. 13 shows an expanded sectional view of the neighborhood of the second mirror 104 in FIG. 11. As shown in FIG. 13, a region comprising the reflectivity adjustment layer 210 and a lower portion of the reflectivity adjustment layer 210 in the second mirror 104 is defined as a first region 291 and a region except the first region 291 in the second mirror 104 is defined as the second region 292. In detail, in FIG. 13, a region indicated by half-tone dot meshing is a first region 291, and a region indicated by slanted lines is a second region 292.

In this surface-emitting laser 200, the reflectivity of a laser beam in the first region 291 is also larger than the reflectivity of a laser beam in the second region 292 as well as the surface-emitting laser 100 of the first embodiment. Hence, the first region 291 generates laser oscillation more efficiently comparing with the second region 292 so as to obtain light with single mode more efficiently.

For example, in the reflectivity adjustment layer 210, the optical thickness "$d_r$" (see FIG. 13) in the portion except the neighborhood of the first electrode 107 can be $(2 m_2-1) \lambda/4$ ($m_2$, natural number) as well as the reflectivity adjustment layer 110. In addition, this reflectivity adjustment layer 210 is composed of the same material for the reflectivity adjustment layer 110 of the first embodiment.

Furthermore, as shown in FIG. 11 and FIG. 13, the thickness of the reflectivity adjustment layer 210 is not a constant, can be increased around the neighborhood of a contact surface with the first electrode 107 instead. Hence, the reflectivity of the first region 291 is lowered (see FIG. 13) as approaching the contact surface in the neighborhood of a contact surface with the first electrode 107.

The surface-emitting laser 200 related to the second embodiment can be formed using the same process for manufacturing the surface-emitting laser 100 regarding the first embodiment on the way of a process (a process forming the electrode 107 and 109). Hence, the description of forming electrodes is omitted.

Figure 9:
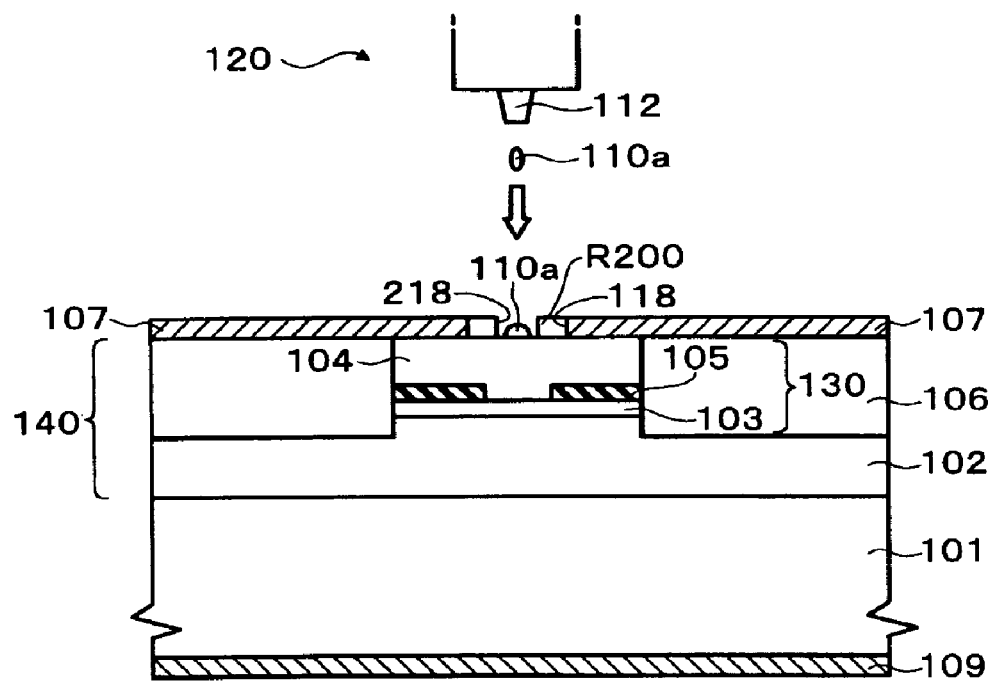
FIG. 9 is a sectional and schematical view showing a process for manufacturing the surface emitting semiconductor laser shown in FIG. 1 to FIG. 3.

After forming the above electrodes, in the first embodiment, a resist layer R200 was formed at the aperture 118 in the process of forming reflectivity adjustment layer 110 and a droplet 10a was ejected onto the aperture 218 formed in the resist layer R200 (see FIG. 9). On the other hand, in this embodiment, in the process of forming reflectivity adjustment layer 210, a droplet 110a is directly ejected within the aperture 118 (see FIG. 9) without forming the resist layer 200 so as to form a precursor (not shown) of the reflectivity adjustment layer. A manufacturing process thereafter (a hardening process) is the same of the first embodiment. Hence, the reflectivity adjustment layer 210 (see FIG. 11 to FIG. 13) is formed thereby.

In addition, before ejecting the droplet 110a in the aperture 118, a process of enhancing wettability with the droplet 110a can be implemented to the side of the emitting surface 108 and the aperture 118, if it is necessary.

The operation of the surface-emitting laser 200 of the present embodiment is basically the same of that of the surface-emitting laser 100 of the first embodiment and detailed description of it is omitted.

In addition, the surface-emitting laser 200 of the present embodiment and a method of manufacturing it have the substantial same functions and effects of the surface-emitting laser 100 of the first embodiment.

Furthermore, in the surface-emitting laser 200 of the present embodiment, the reflectivity adjustment layer 210 can be formed by ejecting the droplet 110a directly onto the aperture 118. Hence, this reflectivity adjustment layer 210 can be formed without using the resist layer R200. Thus, the region having high reflectivity can be necessarily limited by a simple method, enabling a surface-emitting laser to control a stabilized transverse mode.

Figure 14:
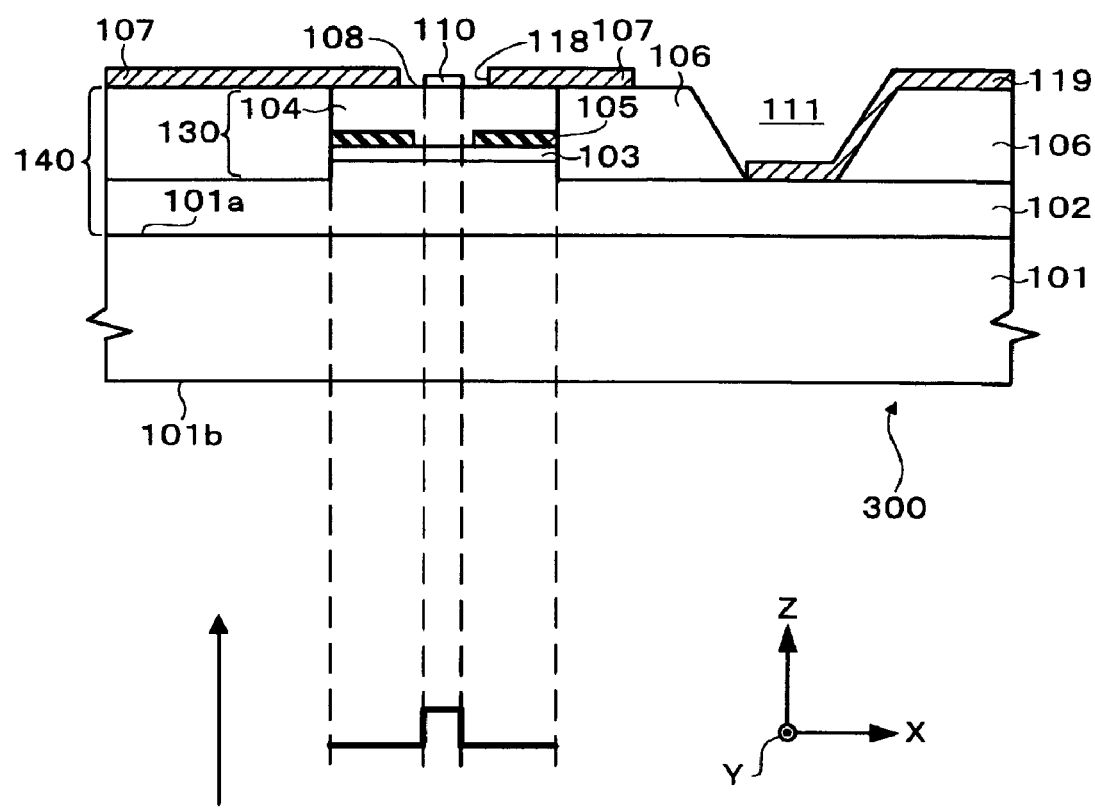
FIG. 14 is a sectional and schematical view showing a surface emitting semiconductor laser related to the third embodiment to which the present invention is applied.
Figure 15:
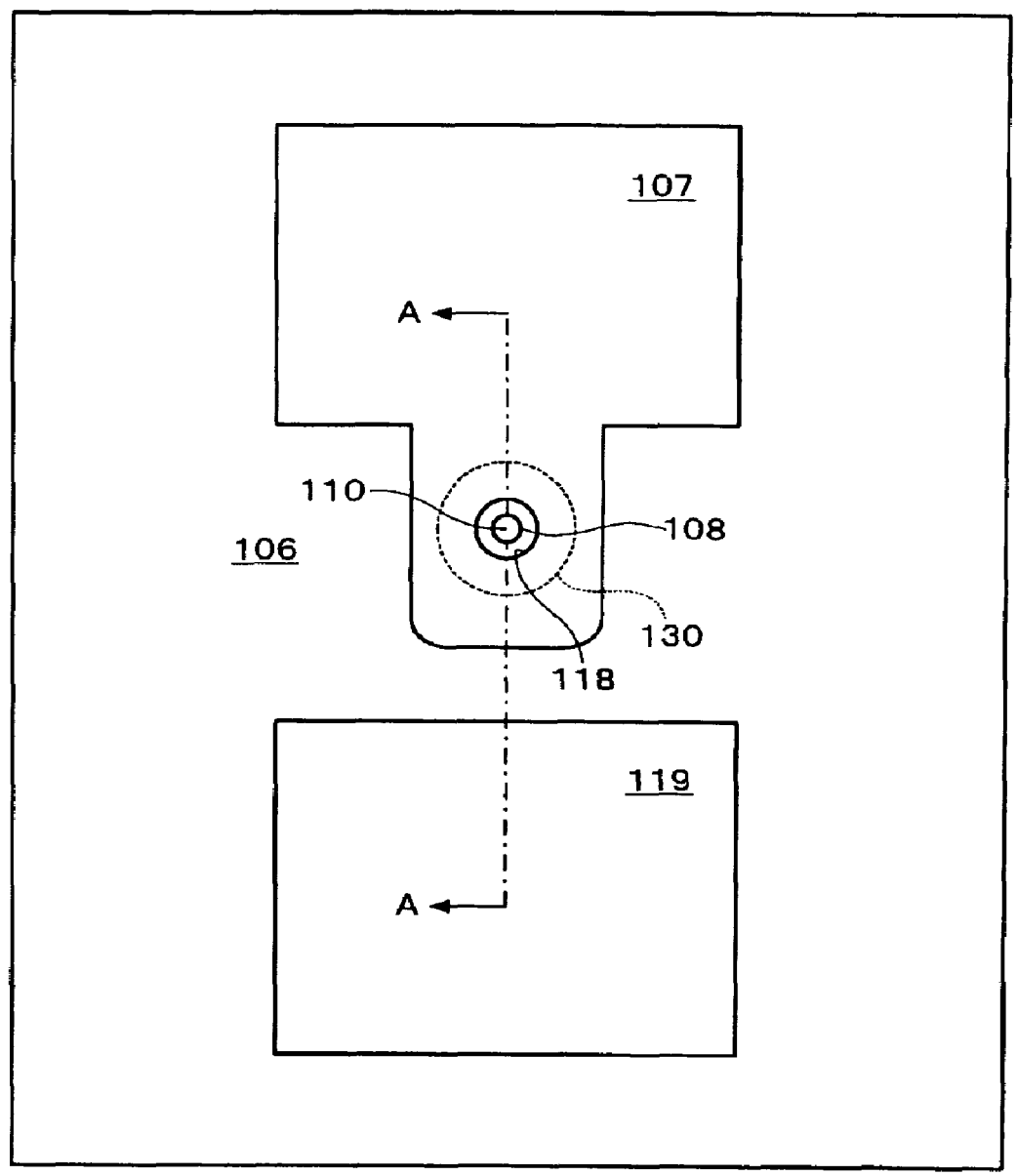
FIG. 15 is a plane and schematical view showing a surface emitting semiconductor laser related to the third embodiment to which the present invention is applied.
Figure 15:
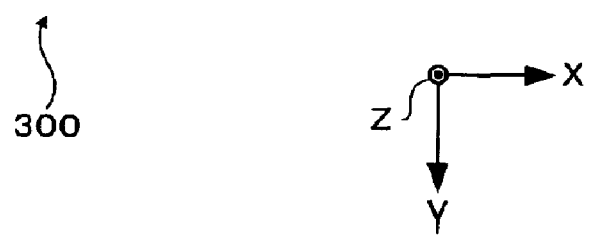

FIG. 14 shows a schematically sectional view of a surface-emitting laser 300 of the third embodiment to which the present invention is applied. FIG. 15 shows a schematically plane view of the surface-emitting laser 300 of the third embodiment to which the present invention is applied. FIG. 14 is a drawing that shows a section along the A—A line in FIG. 15.

The surface-emitting laser 300 of the present embodiment has the same constitution of the surface-emitting laser 100 of the first embodiment except that the second electrode 119 is formed on the surface 101a of the substrate 101 as well as the first electrode 107. The same reference numerals are referred to constituents substantially having the same function of the surface emission laser 100 of the first embodiment and the detailed description of them is omitted.

In this surface-emitting laser 300, two pads of the first electrode 107 and the second electrode 119 are formed on the upper surface 101a of the substrate 101. As shown in FIG. 14, an aperture 111 is formed to reach the first mirror 102 at least.

The surface-emitting laser 300 of the present embodiment is manufactured by the process for manufacturing the surface-emitting laser 100 of the first embodiment on the way. In other words, in a process for manufacturing the surface-emitting laser 100 of the first embodiment described above, after the insulating layer 106 is formed on the resonator 140 (see. FIG. 7), the aperture 111 is formed in the insulating layer 106 (see FIG. 14). As a method of forming the aperture 111, a wet etching method or a dry etching method can be exemplified. The exposed surface of the first mirror 102 corresponding to the bottom surface of the aperture 111 may be etched, if it is necessary.

Subsequently, the first electrode 107 is formed as well as the first embodiment. Furthermore, the second electrode 119 is formed from a bottom surface of the aperture 111 to an upper surface of the insulation layer 106. The second electrode 119 can be composed of the same material that is used for forming the second electrode 109 of the surface-emitting laser 100 of the first embodiment. In addition, in this embodiment, when forming the second electrode 119, by using a lift off method, for example, an area from the exposed surface of the first mirror 102 corresponding to the bottom surface of the aperture 111 to the upper surface of the insulating layer 106 is patterned. A process thereafter (a process for forming the reflectivity adjustment layer 110) is similar to the first embodiment. Hence, the surface-emitting laser 300 can be formed by the above processes.

The operation of the surface-emitting laser 300 is basically the same of the surface-emitting laser 100 of the first embodiment and its explanation is omitted.

Furthermore, the surface-emitting laser 300 regarding the present embodiment, both the first electrode 107 and second electrode 119 are formed on the surface 101a of the substrate 101.

Hence, drive elements, for example, can be mounted above the first electrode 107 and the second electrode 119, via a bump. Hence, a device can be driven without wiring and mounting called as a face down structure can be attained. In addition, the first electrode 107 and the second electrode 119 are formed on the same surface. Thus, a plurality of pads can be formed on the same surface, enabling stabilized mounting to be attained.

Figure 16:
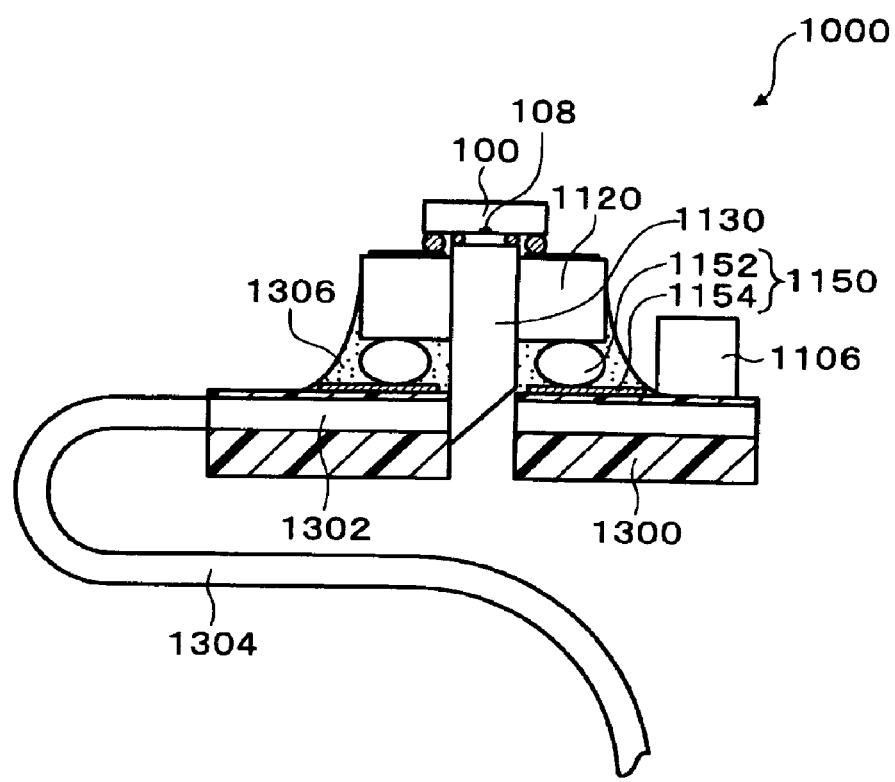
FIG. 16 is a schematical view showing a light module related to the fourth embodiment to which the present invention is applied.

FIG. 16 shows a schematical view of a light module related to the fourth embodiment to which the present invention is applied. The light module related to the embodiment includes a structural body 1000 (see FIG. 16). This structural body 1000 comprises the surface-emitting laser 100 related to the first embodiment (see FIG. 1), a platform 1120, a first optical wave-guide 1130 and an actuator 1150. In addition, this structural body 1000 includes a second optical wave-guide 1302. The second optical wave-guide 1302 is a part of the substrate 1308. An optical wave-guide 1304 for connection may be optically connected to the second optical wave-guide 1302.

The optical wave-guide 1304 for connection may be an optical fiber. In addition, a platform 1120 is fixed to a base 1308 by a resin 1306.

According to the light module of the embodiment, after emitting light from the surface-emitting laser 100 (the emitting surface 108 see FIG. 1), this light is received by a light receiving element (not shown) via the first and the second optical wave-guide 1130 and 1302 (and an optical wave-guide 1304 for connection).

Figure 17:
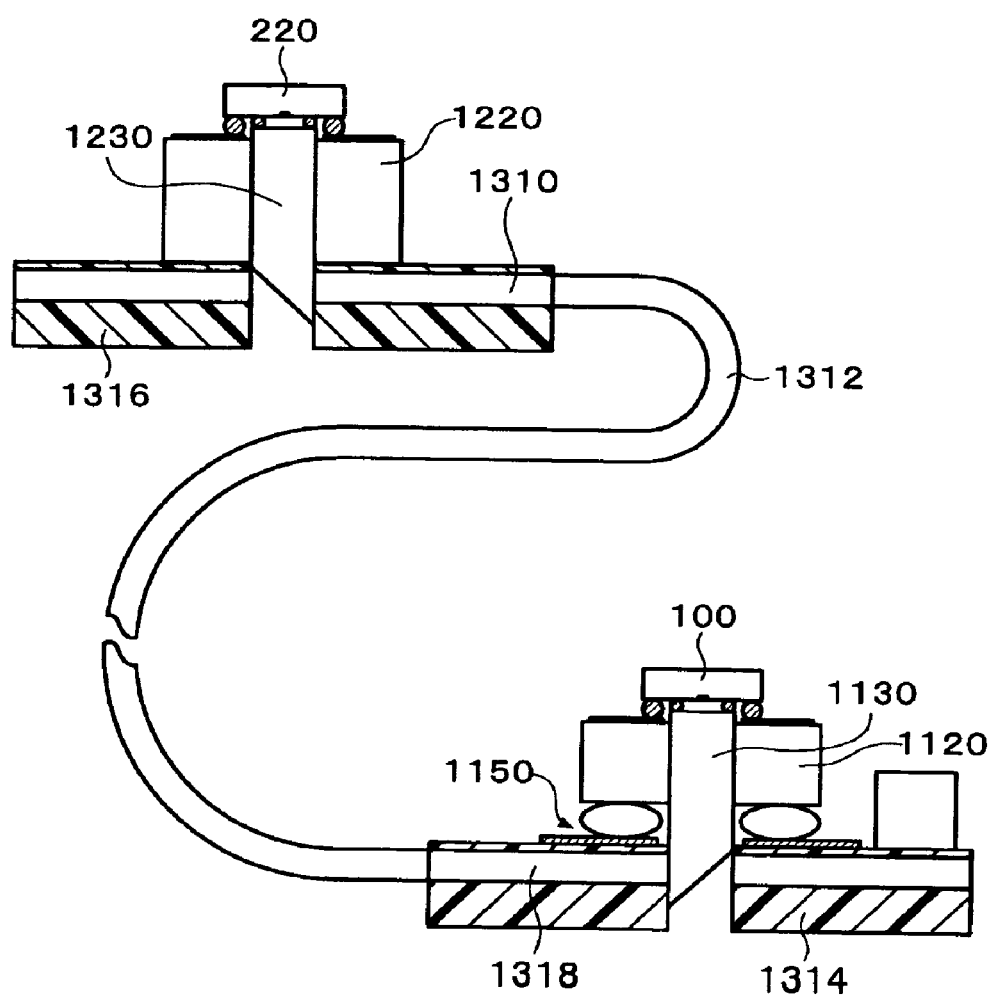
FIG. 17 is a diagram showing a light transmission device related to the fifth embodiment to which the present invention is applied.

FIG. 17 shows a light transmission device related to the fifth embodiment to which the present invention is applied. In this embodiment, a plurality of third optical wave-guides 1230, 1310, and 1312 are provided between the first optical wave-guide 1130 and a light-receiving element 220. In addition, the light transmission device related to the embodiment includes a plurality (two) of substrates 1314 and 1316.

In this embodiment, the third optical wave-guide 1312 is provided between the side of the surface-emitting laser 100 (including the surface-emitting laser 100, the platform 1120, the first optical wave-guide 1130, the second optical wave-guide 1318 and the actuator 1150) and the side of the light receiving element 220 (including a light receiving element 220, the plat form 1220 and the third optical wave-guides 1230 and 1310). As the third optical wave-guide 1312, an optical fiber is employed so as to transmit light among plural electronic devices.

Figure 18:
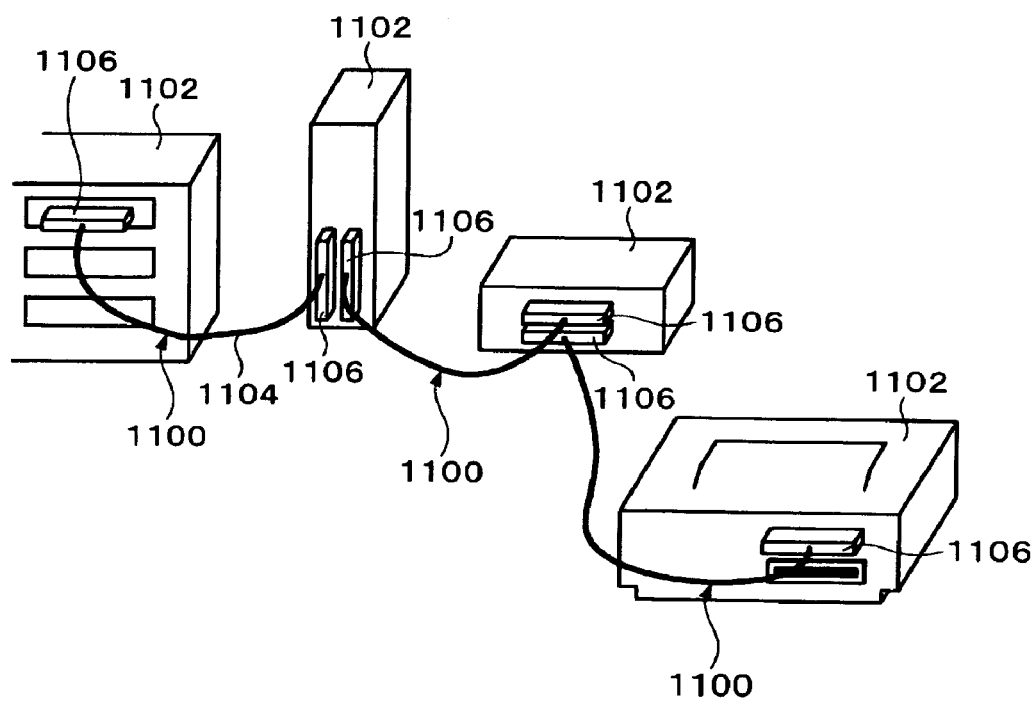
FIG. 18 is a diagram showing usage of the light transmission device related to the fifth embodiment to which the present invention is applied.

For example, in FIG. 18, in the light transmission devices 1100, electronic devices 1102, such as a computer, a display, a storage device, and a printer are mutually connected. Electronic devices 1102 may be information communication devices. A light transmission device 1100 includes a cable 1104 including the third optical wave-guide 1312 such as an optical fiber. In the light transmission device 1100, a plug 1106 may be installed at the both ends of the cable 1104. In each of the plug 1106, the surface-emitting laser 100 and the light receiving element 220 sides are installed. An electrical signal output from any of electronic devices 1102 is converted to an optical signal by an emitting device so as to be transmitted via the cable 1104 and converted to an electrical signal by the receiving element. An electrical signal is input into other electronic device 1102. Thus, according to the light transmission devices 1100 related to the embodiment, information among electronic devices 1102 can be conveyed by optical signals.

Figure 19:
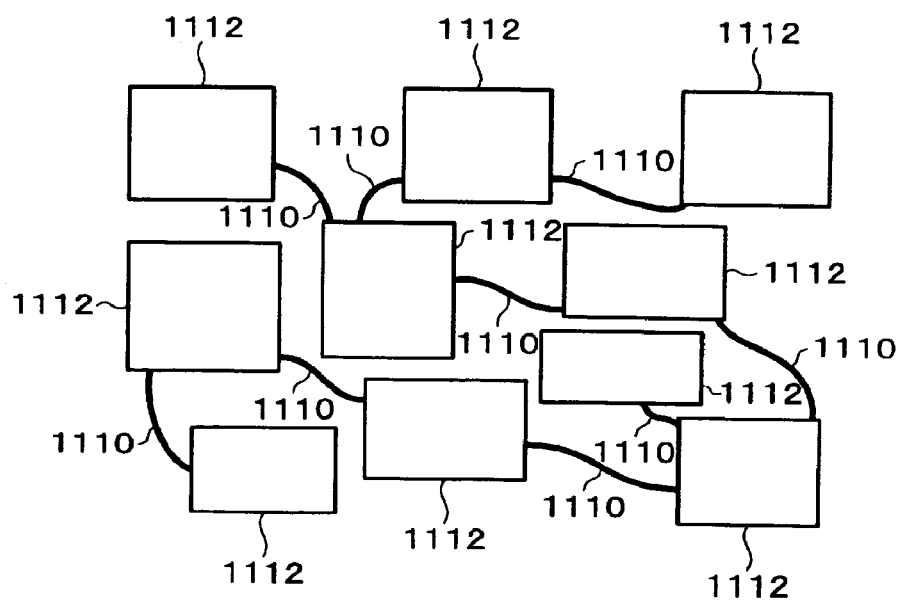
FIG. 19 is a diagram showing usage of the light transmission device related to the fifth embodiment to which the present invention is applied.

FIG. 19 shows a usage of a light transmission device related to the embodiment to which the present invention is applied. Electronic devices 1112 are connected each other by the light transmission devices 1110. Electronic devices 1112 can include a liquid crystal displaying monitor and a CRT for digital display (can be used in a field of finance, mail order, medical care, and education), a liquid crystal projector, a plasma display panel (PDP), a digital TV, a cash register of a retail store (for POS (Point of Sale Scanning) business), a video, a tuner, a game device, a printer, and the like.

In addition, in a light transmission device shown in FIG. 18 and FIG. 19, even when the surface-emitting laser 200 (see FIG. 11 to FIG. 13) or the surface-emitting laser 300 is used instead of the surface-emitting laser 100 the same functions and effects can be attained.

Figure 20:
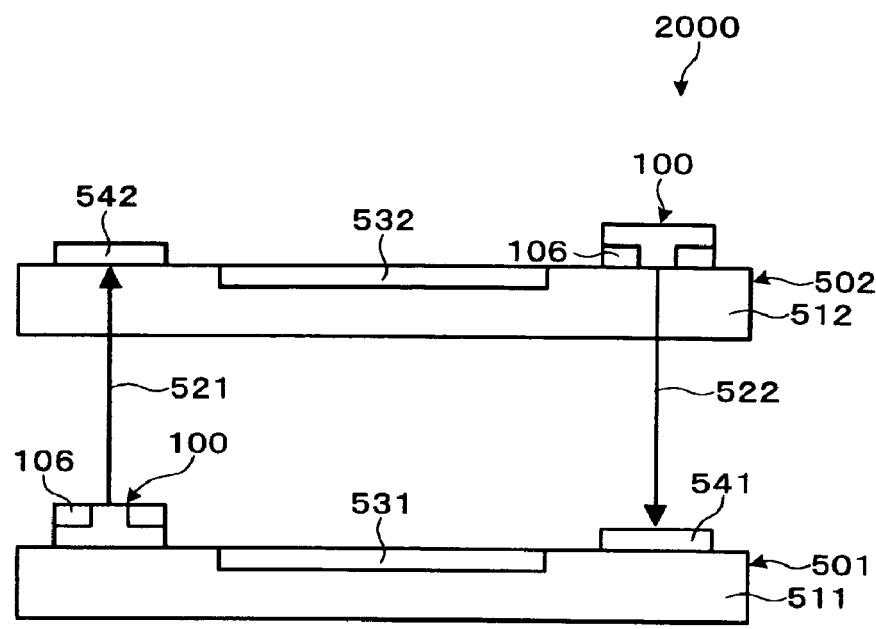
FIG. 20 is a diagram showing usage of a light transmission device related to the sixth embodiment to which the present invention is applied.

FIG. 20 shows a drawing explaining a light transmission device related to a sixth embodiment to which the present invention is applied. In this embodiment, an example where a light transmission device is a light inter connection device 2000 between IC chips is described.

The light inter connection device 2000 of the present embodiment is provided with a plurality of stacked IC chips. In the light inter-connection device 2000 of the present embodiment, as shown in FIG. 20, two IC chips are stacked. But, numbers of stacked IC chips are not limited this number.

In the light inter connection device 2000 of the present embodiment, a laser beams 521, 522 are transmitted between the stacked IC chips 501, and 502 to exchange data. IC chips 501 and 502 include substrates (for example, a silicon substrate) 511 and 512 and IC regions 531 and 532 formed on the substrates 511 and 512 respectively. A CPU, a memory, and an ASIC are exemplified as IC chips 501 and 502.

In the IC chip 501, the surface-emitting laser 100 related to the first embodiment and the light detection device 541 are installed on the substrate 511. Similarly, in the IC chip 502, the surface-emitting laser 100 related to the first embodiment and the light detection device 542 are installed on the substrate 512. In addition, this embodiment disclosed a case when the surface-emitting laser 100 related to the first embodiment is installed on the substrates 511 and 512 respectively. But, one of or both two of the surface-emitting lasers 100 can be replaced with the second or the third surface-emitting laser 200 and 300.

Next, operation of this light inter connection device 2000 is described referring to FIG. 20. In this light inter connection device 2000, a signal electrically processed in the IC region 531 of the IC chip 501 is converted to a laser pulse signal by the resonator 140 (see FIG. 1 not shown in FIG. 20) of the surface-emitting laser 100 and then transmitted to the light detection device 542 of the IC chip 502. The light detection device 542 converts a received laser pulse to an electrical signal, and transmits it to the IC region 532.

On the other hand, the same operation is implemented in case when a laser from the surface-emitting laser 100 formed on the IC chip 502 is transmitted to the light detection device 541. In other words, in the light inter connection device 2000, a signal electrically processed in the IC region 532 of the IC chip 502 is converted to a laser pulse signal by the resonator 140 of the surface-emitting laser 100 and then transmitted to the light detection device 541 of the IC chip 501. The light detection device 541 converts a received laser pulse to an electrical signal, and transmits it to the IC region 531. Hence, data are exchanged between IC chips 501, 502 via a laser.

In addition, when the substrates 511 and 512 are composed of silicon, the wavelength of a laser oscillation in the resonator of the surface-emitting laser 100 is set to be over 1.1 µm, enabling the light emitted from the surface-emitting laser 100 to transit through the substrates 511 and 512 (silicon substrates).

By the way, generally, the following problems are raised in signal transmission between IC chips via electrical connection accompanied with high frequency and high speed of signal processing.

A shift (skew) of a signal transmission timing between wiring occurs.

Power consumption in transmitting a high frequency electrical signal is increased.

A design of wiring layout becomes difficult.

Impedance matching is necessary

An interception measure against ground noise is necessary

On the other hand, these problems can be solved by transmitting signals among IC chips with light signals such as the light inter connection device 2000 of the present embodiment.

It should be understood that the present invention does not limit the above-mentioned embodiments, but can apply various kinds of modifications. For example, the present invention can include a constitution which is substantially the same constitution explained in the embodiments (constitution, for example, having the same function, the same method and the same result or the same objective and result). In addition, the present invention includes a constitution that non-essential parts of constitution explained in the embodiment are replaced with others. In addition, the present invention includes a constitution that can achieve the same functions and effects shown in the constitution explained in the above embodiments or the same objective thereof. In addition, the present invention includes a constitution that publicly known technology is added to the constitution explained in the above-mentioned embodiments.

For example, in the above embodiment, a surface emitting semiconductor laser including a single column-like portion was explained. But, the sprit of the present invention can be applied to a plurality of column-like portions in a substrate. In addition, a case when a plurality of surface emitting semiconductor lasers is arranged in an array has the same functions and effects.

In addition, for example, the spirit of the present invention can apply to a case when p-type is replaced with n-type in each of semiconductor layers. In the above-mentioned embodiments, a material of AlGaAs group was employed. But other materials, for example, such as a GaInP group, a Zn S Se group, an InGaN group, an AlGaN group, an InGaAs group, a GaInAs group and GaAsSb group can be employed depending on a wavelength of a laser oscillation.

Furthermore, in the above-mentioned embodiment, a GaAs substrate was shown as a compound semiconductor substrate. But, other compound semiconductor substrates, for example, such as a GaN substrate, an AlN substrate, an InP substrate, a GaP substrate, a ZnSe substrate, a ZnS substrate, a CdTe substrate, a ZnTe substrate, and a CdS substrate can be employed.

Figure 21:
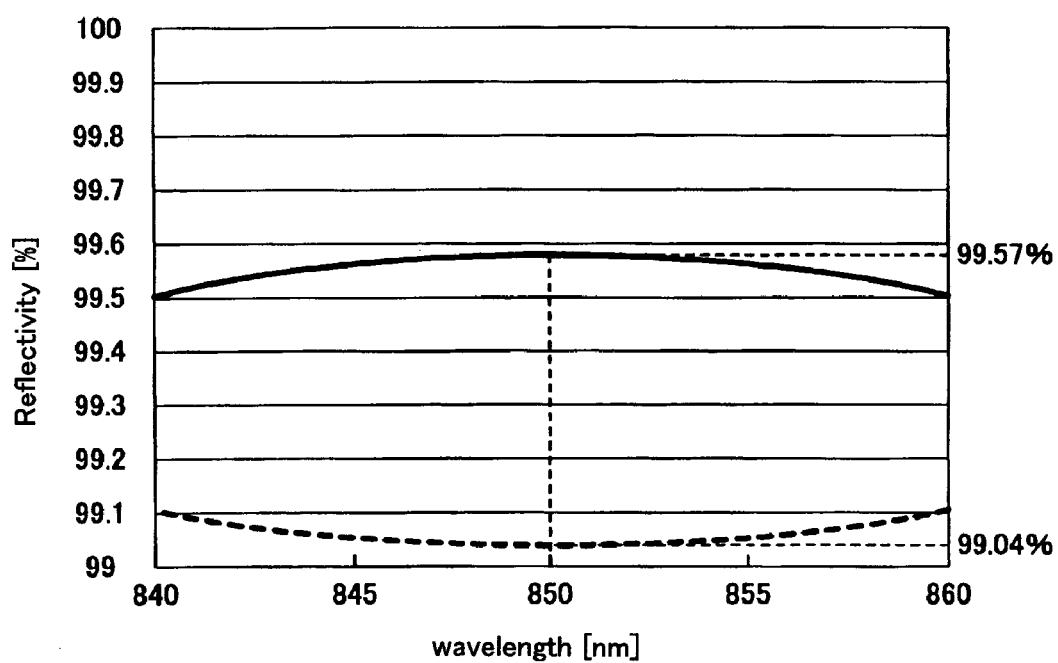
FIG. 21 is a diagram showing the reflectivity of the first and the second regions 191 and 192 in the second mirror 104 in the experiment example.

With respect to the surface-emitting laser 100 of the present embodiments, a simulation test of the reflectivity of the second mirror 104 was implemented. FIG. 21 shows the reflectivity of the first and second regions 191 and 192 in the second mirror 104 provided by this measurement. In addition, in this measurement, each of layers including the surface-emitting laser 100 has the same constitution and composition shown in the above-mentioned embodiments. The wavelength of the oscillation in the surface-emitting laser 100 is 850 nm. In addition, in this measurement, reflectivity shown by the example does not include the reflectivity of the current aperture 105.

At first, when the second mirror 104 includes a film including 25 pairs of multi layers where n-type $Al_{0.9}Ga_{0.1}As$ layers and n-type $Al_{0.15}Ga_{0.85}As$ layers are deposited alternatively and its optical thickness is $\lambda/4$, but that of the top layer is $\lambda/2$, the reflectivity of the second mirror 104 was 99.04% about light of its wavelength of the oscillation; 850 nm. In this case, when the reflectivity adjustment layer 110 of which the optical thickness was $\lambda/4$, and formed on the emitting surface 108 in addition to the top layer of which the optical thickness was $\lambda/2$, the reflectivity of the first region 191 (see FIG. 3) among the second mirror 104 was 99.57% and the reflectivity of the second region 192 (see FIG. 3) was 99.04% as well as the case where reflectivity of the reflectivity adjustment layer 110 is not formed. In addition, FIG. 21 shows the reflectivity of each wavelength in the first region 191 and the second region 192 respectively. In FIG. 21, a solid line shows the reflectivity of the first region 191 and a broken line shows the reflectivity in the second region 192.

According to the experimental example, the optical thickness of the top layer in the second mirror 104 was $\lambda/2$ and the reflectivity adjustment layer 110 of which the optical thickness was $\lambda/4$, was formed on the emitting surface 108, enabling the reflectivity of a laser in the first region 191 to be larger than that in the second region 192 (see FIG. 21). Thus, the threshold value of the laser oscillation in the first region 191 can be reduced comparing with that in the second region 192, enabling a laser to have a stabilized transverse mode.

While this invention has been described in conjunction with specific embodiments thereof, it is evident that many alternatives, modifications, and variations will be apparent to those skilled in the art. Accordingly, preferred embodiments of the invention as set forth herein are intended to be illustrative, not limiting. Various changes may be made without departing from the spirit and scope of the invention.

What is claimed is:

1. A surface emitting semiconductor laser including a resonator formed on a substrate and emitting a laser beam toward a direction vertical to the substrate from an emitting surface formed on an upper surface of the resonator, the resonator including:

a first mirror formed above the substrate;

an active layer; and a second mirror located oppositely to the first mirror and sandwiching the active layer therebetween;

a reflectivity adjustment layer that is formed on the emitting surface;

the second mirror including a layer of which an optical thickness is $m_1 \lambda/2$ ($m_1$, a natural number >0), when a wavelength of the laser beam is $\lambda$; and an optical thickness of the reflectivity adjustment layer being $(2 m_2-1) \lambda/4$ ($m_2$, a natural number >0), the layer of which the optical thickness is $m_1 \lambda/2$ is formed in whole area of the second mirror, the reflectivity adjustment layer is formed within a part of an aperture formed on the upper surface of the resonator.

2. The surface emitting semiconductor laser claimed in claim 1, reflectivity of the laser beam in a first region being larger than reflectivity of the laser beam in a second region, when the first region is defined as a region comprising the reflectivity adjustment layer and a lower region of the reflectivity adjustment layer in the second mirror, and the second region is defined as a region except the first region in the second mirror.

3. A surface emitting semiconductor laser including a resonator formed on a substrate and emitting a laser beam toward a direction vertical to the substrate from an emitting surface formed on an upper surface of the resonator, comprising:

a first electrode and a second electrode being formed on the upper surface of the resonator, at least a part of the first electrode being formed on the upper surface of the resonator, the resonator including a first mirror formed above the substrate, an active layer, and a second mirror located oppositely to the first mirror and sandwiching the active layer therebetween;

an aperture that is formed on the upper surface of the resonator, the emitting surface being formed on the upper surface of the resonator within the aperture, and a reflectivity adjustment layer being formed in the emitting surface; and a thickness of the reflectivity adjustment layer varies;

the second mirror including a layer of which the optical thickness is $m_1 \lambda/2$ ($m_1$, a natural number >0), when a wavelength of the laser beam is $\lambda$, the layer of which the optical thickness is $m_1 \lambda/2$ is formed in whole area of the second mirror, the reflectivity adjustment layer is formed within a part of the aperture.

4. The surface emitting semiconductor laser claimed in 3, reflectivity of the laser beam in a first region being larger than the reflectivity of the laser beam in a second region, when the first region is defined as a region comprising the reflectivity adjustment layer and a lower region of the reflectivity adjustment layer in the second mirror, and the second region is defined as a region except the first region in the second mirror.

5. The surface emitting semiconductor laser claimed in claim 4, the optical thickness of the reflectivity adjustment layer is $(2 m_2-1) \lambda/4$ ($m_2$, a natural number >0 ).

6. The surface emitting semiconductor laser claimed in claim 1, the layer of which the optical thickness is $m_1 \lambda/2$ constituting a top layer of the second mirror.

7. The surface emitting semiconductor laser claimed in claim 1, the reflectivity adjustment layer being transparent to the laser beam.

8. The surface emitting semiconductor laser claimed in claim 1, the plane configuration of the reflectivity adjustment layer being a circle.

9. The surface emitting semiconductor laser claimed in claim 8, the diameter of the reflectivity adjustment layer being equal to or less than 6 µm.

10. The surface emitting semiconductor laser claimed in claim 8, the emitting surface being a circle and the reflectivity adjustment layer being arranged coaxially with a center axis of the emitting surface.

11. The surface emitting semiconductor laser claimed in claim 1, the reflectivity adjustment layer being composed of at least one of a resin hardened by heat and a resin hardened by an ultraviolet ray.

12. The surface emitting semiconductor laser claimed in claim 1, the thickness of the reflectivity adjustment layer in an area close to a contact surface with an electrode being larger than that of an other area.

13. The surface emitting semiconductor laser claimed in claim 1, the second mirror being provided with a current blocking layer having a concentric circle-shaped plane, and an area of an inside circle of the current aperture that is larger than a sectional area of the reflectivity adjustment layer.

14. The surface emitting semiconductor laser claimed in claim 1, at least one part of the resonator including a column-like portion.

15. A light module comprising an optical wave-guide and the surface emitting semiconductor laser claimed in claim 1.

16. A light transmission device comprising the light module according to claim 15.

17. A method of manufacturing a surface emitting semiconductor laser including a resonator formed on a substrate and emitting a laser beam toward a direction vertical to the substrate from an emitting surface formed on an upper surface of the resonator, comprising:

forming a resonator on the substrate;

forming a layer of which an optical thickness is m1 $\lambda/2$ (m1, a natural number>0 ) in the second mirror; and forming a reflectivity adjustment layer of which an optical thickness is $(2 m_2-1) \lambda/4$ ($m_2$, a natural number >0 ), forming the layer of which the optical thickness is $m_1 \lambda/2$ in whole area of the second mirror, and forming the reflectivity adjustment layer within a part of an aperture formed on the upper surface of the resonator.

18. The method of manufacturing a surface emitting semiconductor laser claimed in claim 17, forming the reflectivity adjustment layer further comprising forming a precursor of the reflectivity adjustment layer by ejecting a droplet onto the emitting surface, and hardening the precursor thereafter to form the reflectivity adjustment layer on the emitting surface so as to form the reflectivity adjustment layer on the emitting surface.

19. A method of manufacturing a surface emitting semiconductor laser including a resonator formed on a substrate and emitting a laser beam toward a direction vertical to the substrate from an emitting surface formed on an upper surface of the resonator, comprising:

forming a resonator on the substrate;

forming a first electrode and a second electrode to inject a current into the resonator, at least a part of the electrode being formed on the upper surface of the resonator and an aperture is formed on the upper surface of the resonator, forming a first mirror above the substrate, an active layer, and a second mirror located oppositely to the first mirror and sandwiching the active layer therebetween, and forming a reflectivity adjustment layer on the emitting surface, wherein a thickness of the reflectivity adjustment layer varies, forming on the second mirror a layer of which the optical thickness is $m_1 \lambda/2$ ($m_1$, a natural number >0 ), when a wavelength of the laser beam is $\lambda$, the layer of which the optical thickness is $m_1 \lambda/2$ is formed in whole area of the second mirror, the reflectivity adjustment layer is formed within a part of the aperture.

20. The method of manufacturing a surface emitting semiconductor laser claimed in claim 19, forming the reflectivity adjustment layer further comprising forming a precursor of the reflectivity adjustment layer with ejecting a droplet onto the emitting surface, and hardening the precursor thereafter to form the reflectivity adjustment layer on the emitting surface.

* * * * *